United States Patent
Sakai et al.

(10) Patent No.: US 12,199,613 B2
(45) Date of Patent: Jan. 14, 2025

(54) SEMICONDUCTOR CIRCUIT INCLUDING LATCH CIRCUIT FOR ERROR CORRECTION

(71) Applicant: SONY SEMICONDUCTOR SOLUTIONS CORPORATION, Kanagawa (JP)

(72) Inventors: Lui Sakai, Kanagawa (JP); Yasuo Kanda, Kanagawa (JP); Masahiro Segami, Kanagawa (JP); Keizo Hiraga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/252,360

(22) PCT Filed: Nov. 10, 2021

(86) PCT No.: PCT/JP2021/041395
§ 371 (c)(1),
(2) Date: May 9, 2023

(87) PCT Pub. No.: WO2022/107670
PCT Pub. Date: May 27, 2022

(65) Prior Publication Data
US 2024/0014810 A1    Jan. 11, 2024

(30) Foreign Application Priority Data

Nov. 17, 2020    (JP) ................ 2020-191177

(51) Int. Cl.
| | | |
|---|---|---|
| H03K 3/037 | (2006.01) | |
| G11C 11/16 | (2006.01) | |
| G11C 29/42 | (2006.01) | |
| H03K 3/3562 | (2006.01) | |
| G11C 11/417 | (2006.01) | |

(52) U.S. Cl.
CPC .......... *H03K 3/0372* (2013.01); *G11C 11/165* (2013.01); *G11C 29/42* (2013.01);
(Continued)

(58) Field of Classification Search
CPC .. H03K 3/0372; H03K 3/3562; H03K 19/003; G11C 11/165; G11C 29/42;
(Continued)

(56) References Cited

U.S. PATENT DOCUMENTS 7,835,179 B1 *  11/2010  Prabhakar .............. G11C 16/28
                                                        365/185.24
2003/0086306 A1 *  5/2003  Takahashi ........... G06F 11/1008
                                                        714/E11.034
(Continued)

FOREIGN PATENT DOCUMENTS

| JP | 2003-151297 A | 5/2003 |
|---|---|---|
| JP | 2014-006889 A | 1/2014 |

(Continued)

OTHER PUBLICATIONS

F. S. Alghareb, R. Zand and R. F. Demara, "Non-Volatile Spintronic Flip-Flop Design for Energy-Efficient SEU and DNU Resilience," in IEEE Transactions on Magnetics, vol. 55, No. 3, pp. 1-11, Mar. 2019, Art No. 3400611, (Year: 2019).*

(Continued)

*Primary Examiner* — Cynthia Britt
(74) *Attorney, Agent, or Firm* — CHIP LAW GROUP

(57) ABSTRACT

A semiconductor circuit according to an embodiment of the present disclosure includes a nonvolatile latch circuit that stores k-bit data, and m-bit error correction data for the k-bit data.

12 Claims, 12 Drawing Sheets

(52) U.S. Cl.
CPC .......... *H03K 3/3562* (2013.01); *G11C 11/161* (2013.01); *G11C 11/417* (2013.01)

(58) Field of Classification Search
CPC ..... G11C 11/161; G11C 11/417; G11C 5/148; G11C 2029/0411; G06F 11/10
See application file for complete search history.

(56) References Cited

U.S. PATENT DOCUMENTS

| | | | | |
|---|---|---|---|---|
| 2010/0265760 | A1* | 10/2010 | Sakimura | G11C 11/1659 365/158 |
| 2013/0326309 | A1* | 12/2013 | Yoneda | G06F 12/0246 714/763 |
| 2019/0228829 | A1* | 7/2019 | Hiraga | G06F 11/1068 |

FOREIGN PATENT DOCUMENTS

| | | |
|---|---|---|
| JP | 2014-222425 A | 11/2014 |
| JP | 2017-197486 A | 11/2017 |
| JP | 2018-060277 A | 4/2018 |
| JP | 2019-050068 A | 3/2019 |

OTHER PUBLICATIONS

International Search Report and Written Opinion of PCT Application No. PCT/JP2021/041395, issued on Jan. 11, 2022, 09 pages of ISRWO.

\* cited by examiner

[ FIG. 1 ]
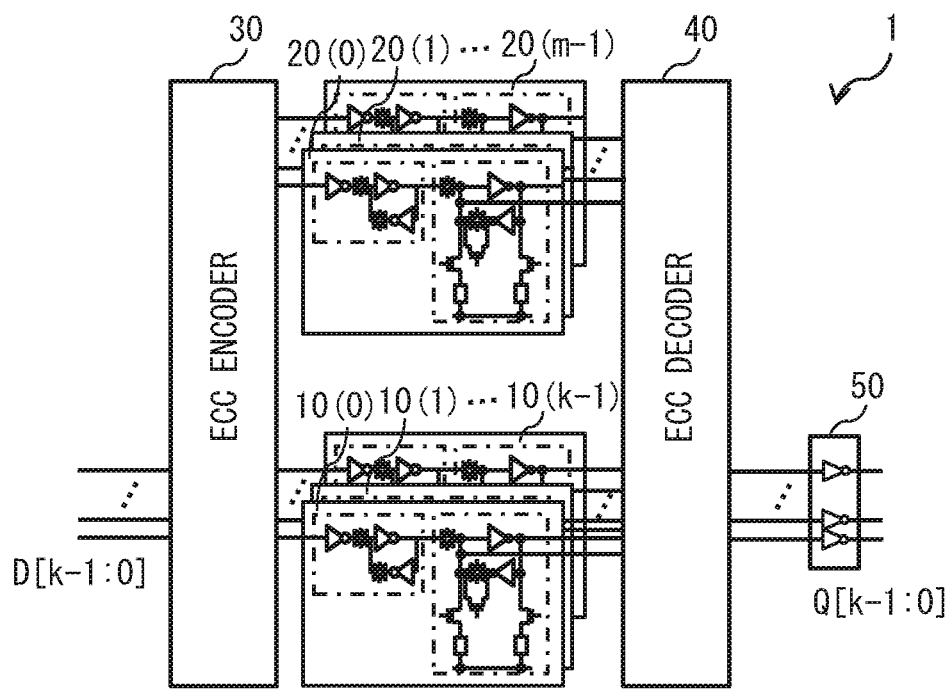
[ FIG. 2 ]
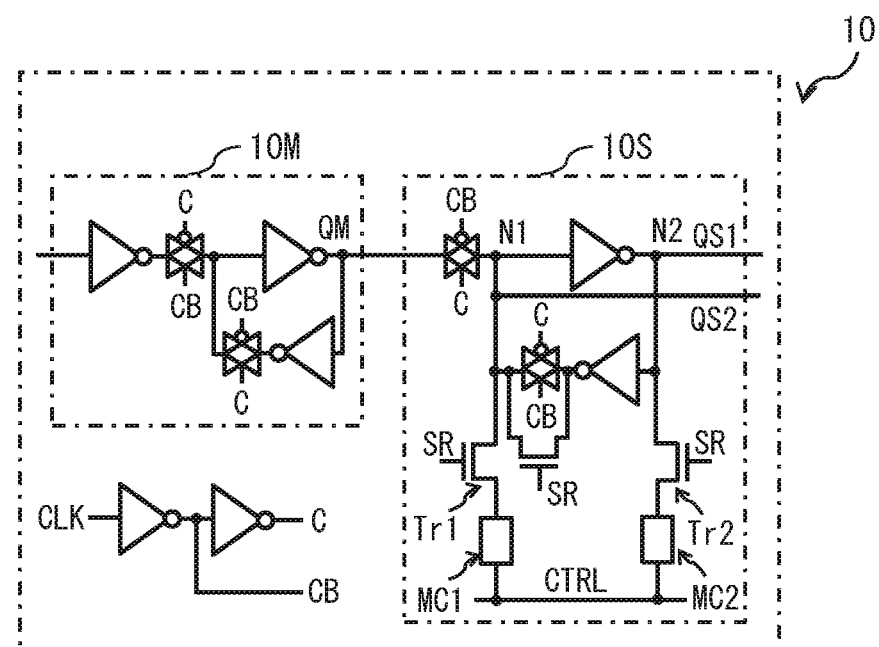

[ FIG. 3 ]
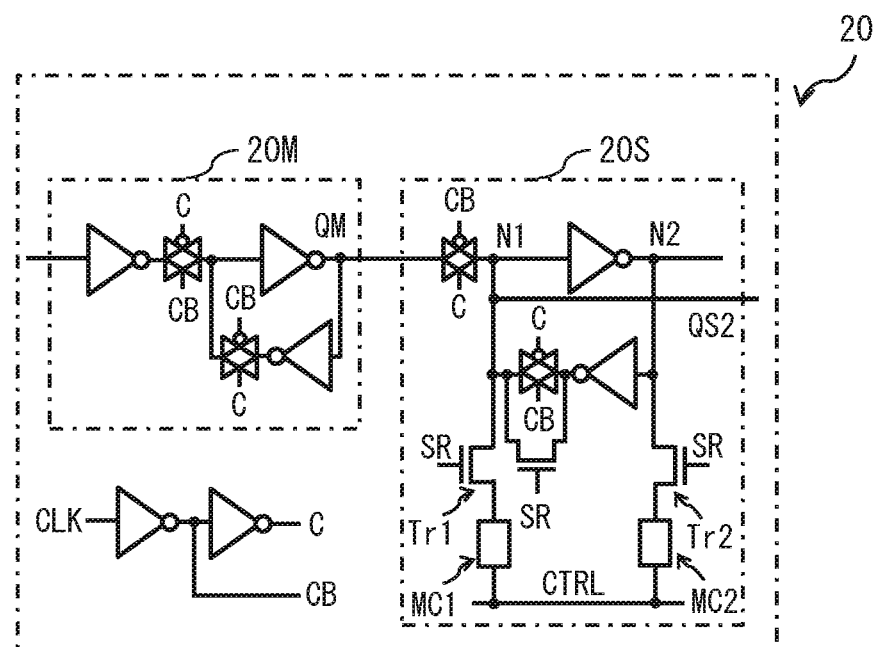

[ FIG. 4 ]
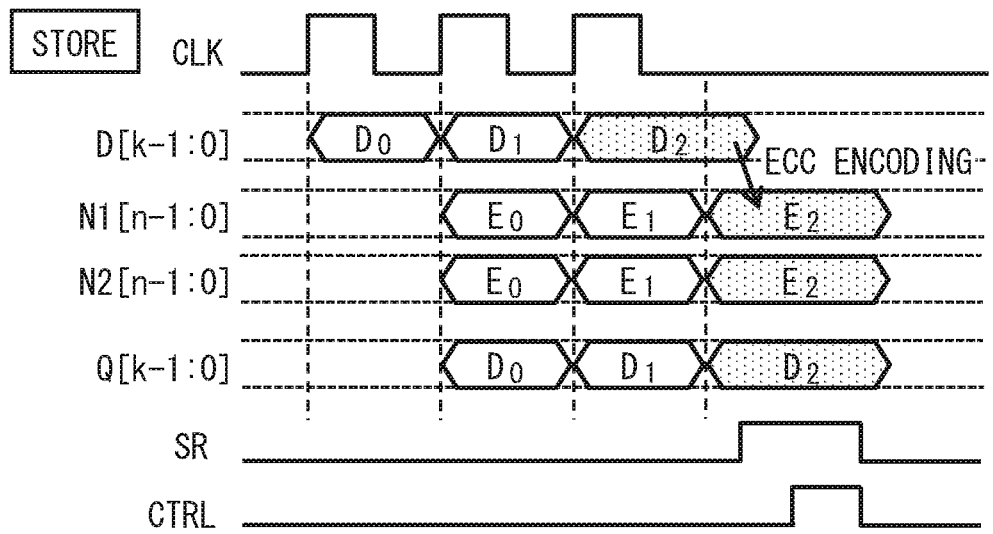
[ FIG. 5 ]
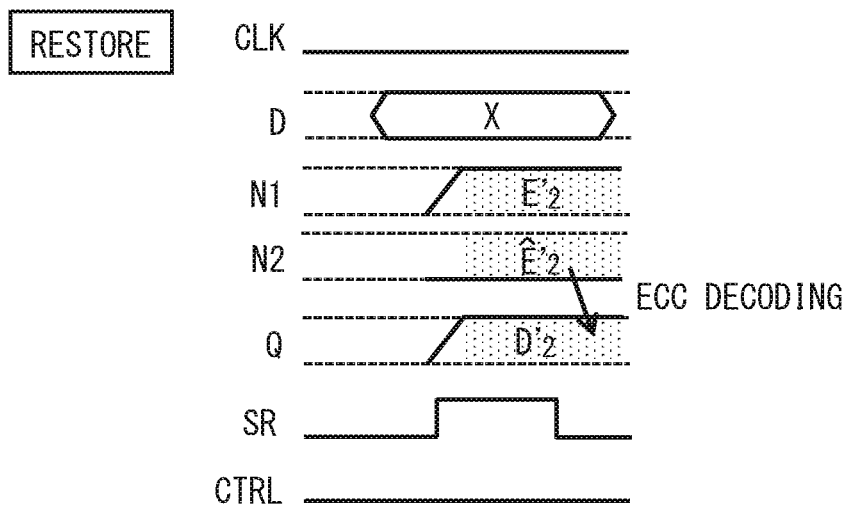

[ FIG. 6 ]
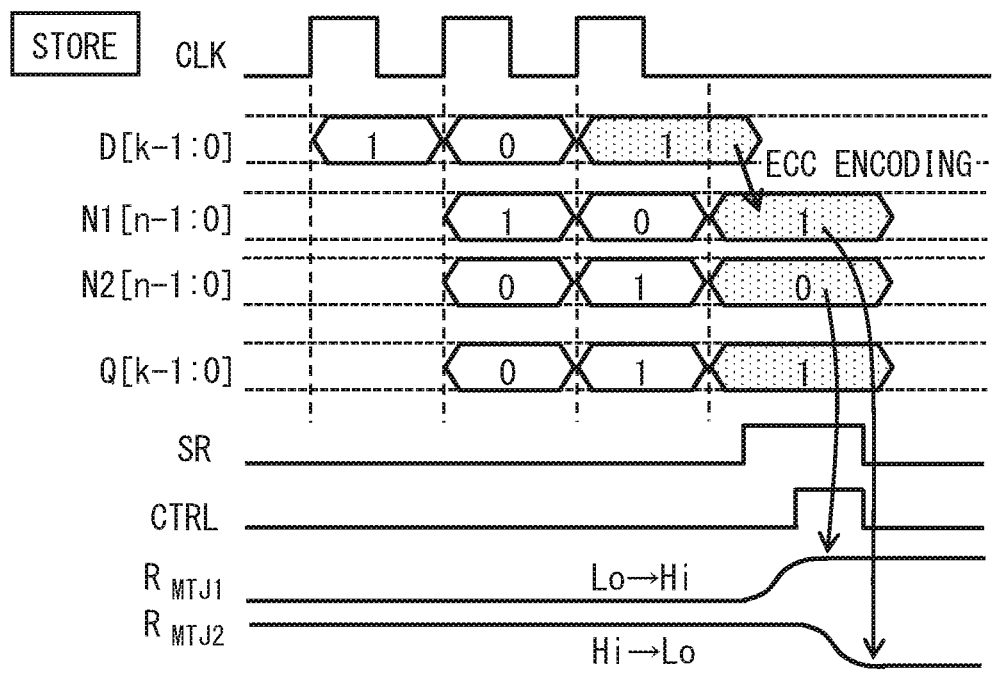
[ FIG. 7 ]
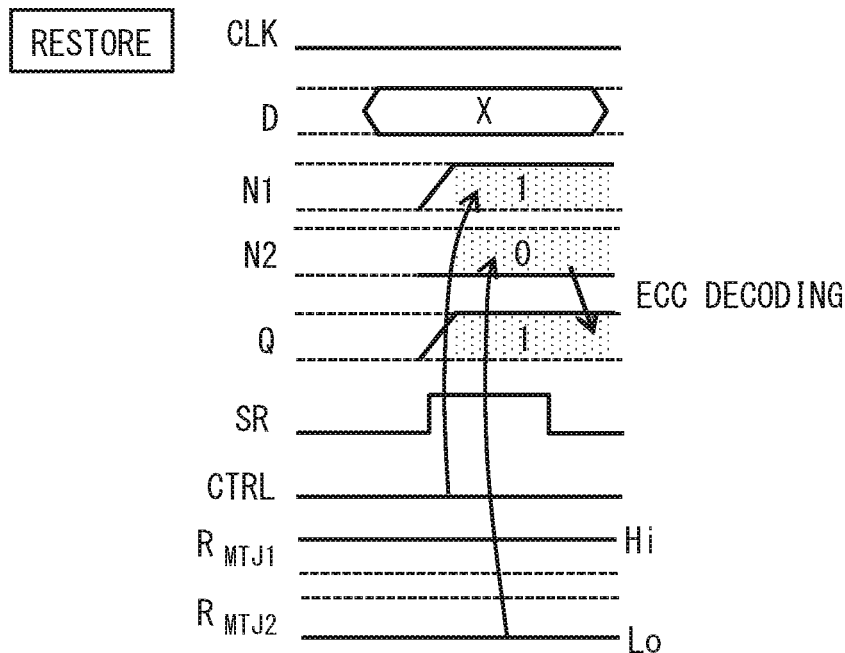

[ FIG. 8 ]
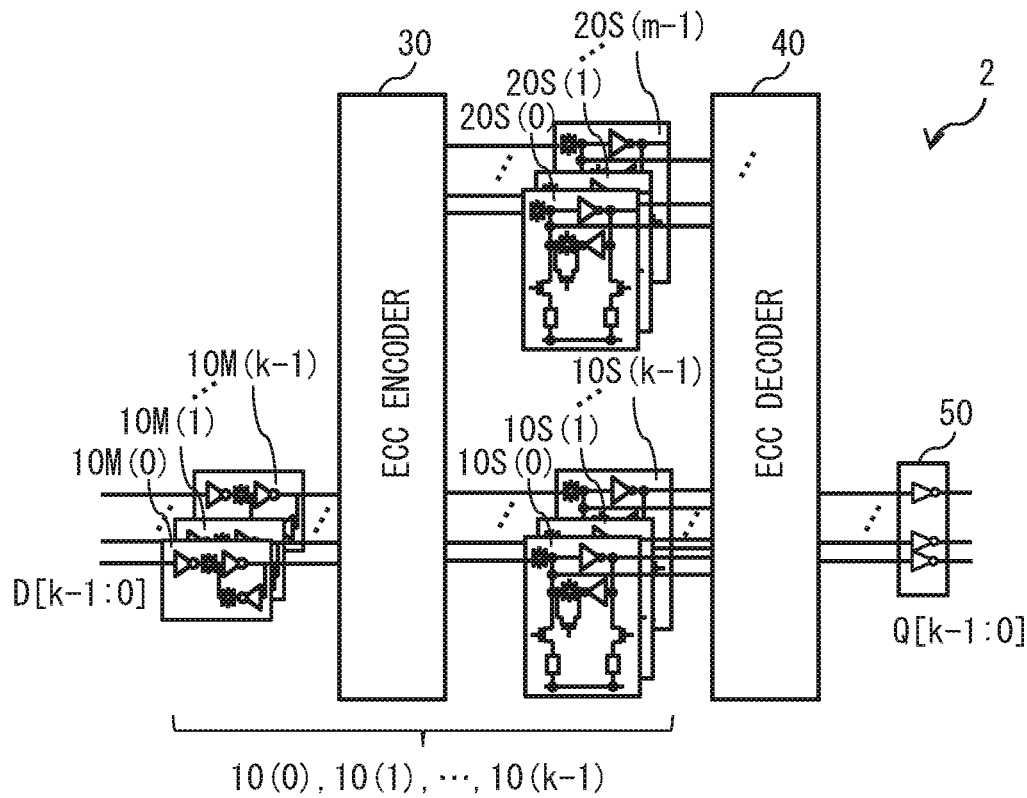
[ FIG. 9 ]
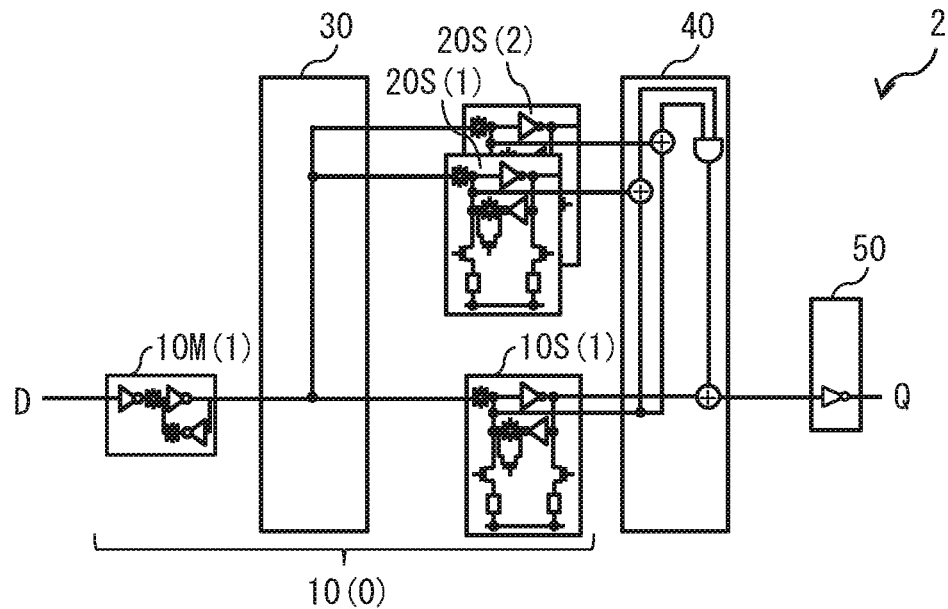

[ FIG. 10 ]
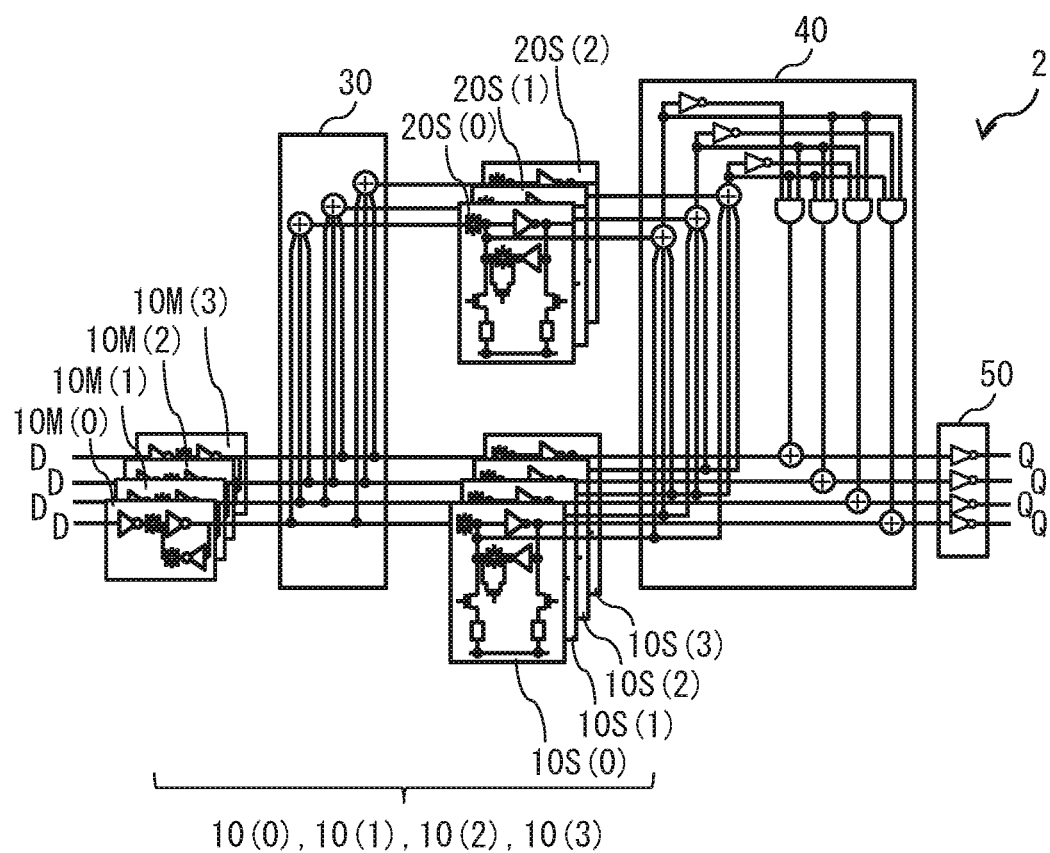

[ FIG. 11 ]
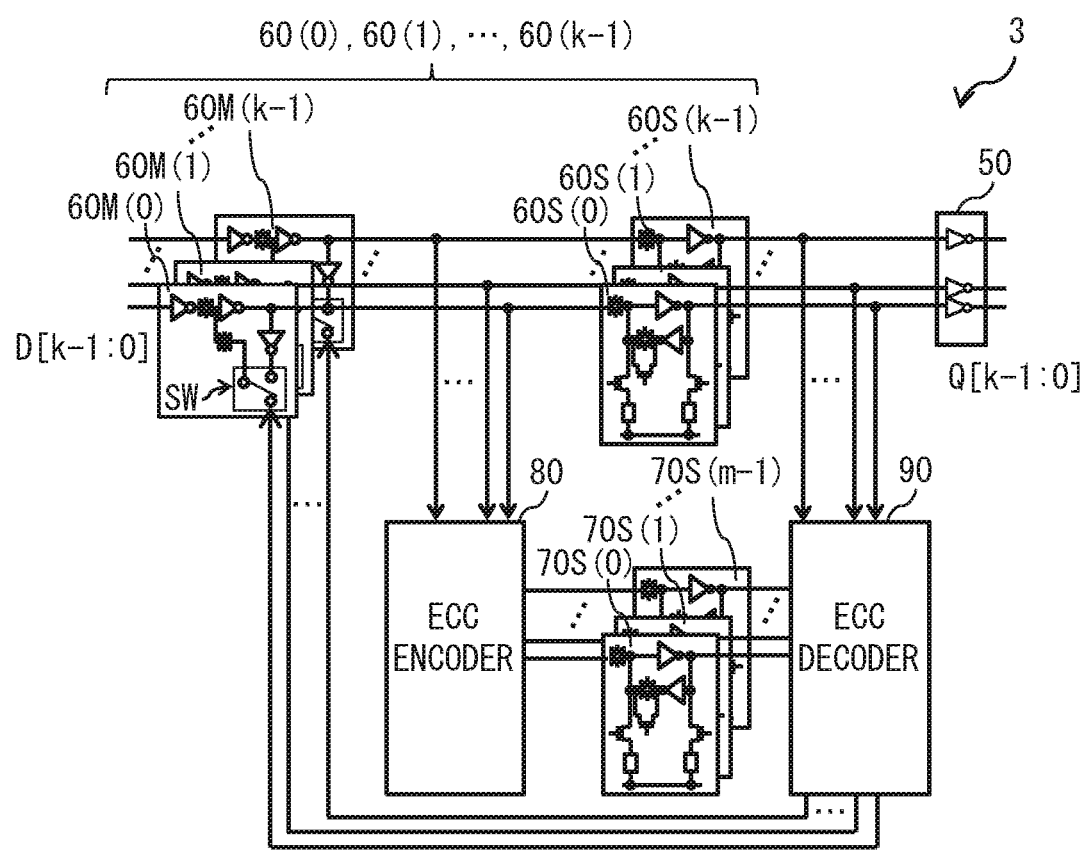

[ FIG. 12 ]
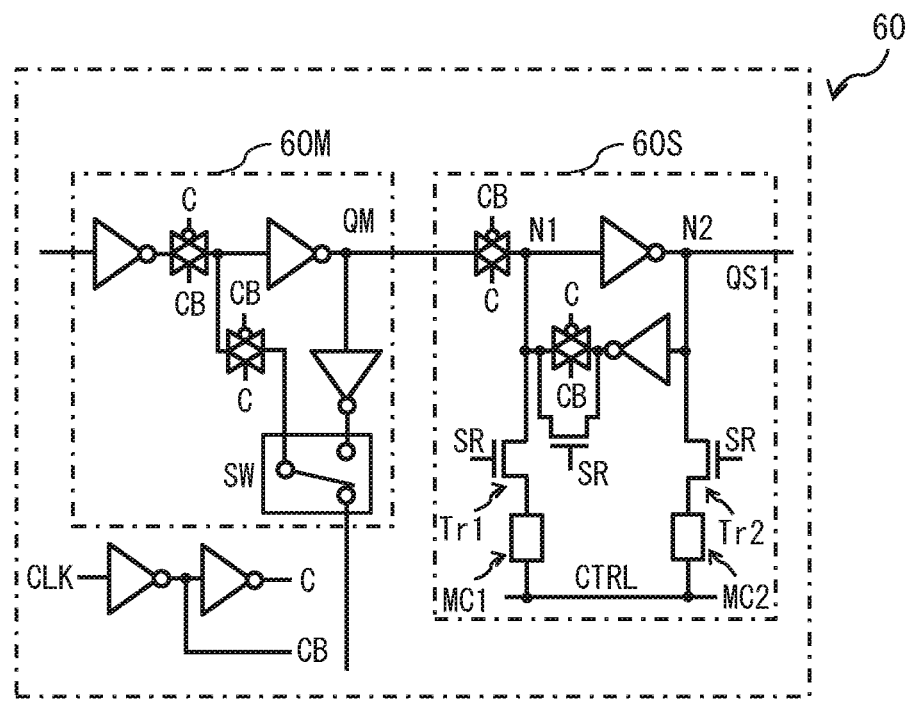
[ FIG. 13 ]
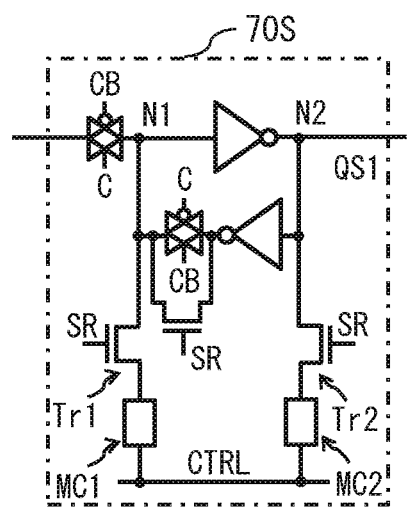

[ FIG. 14 ]
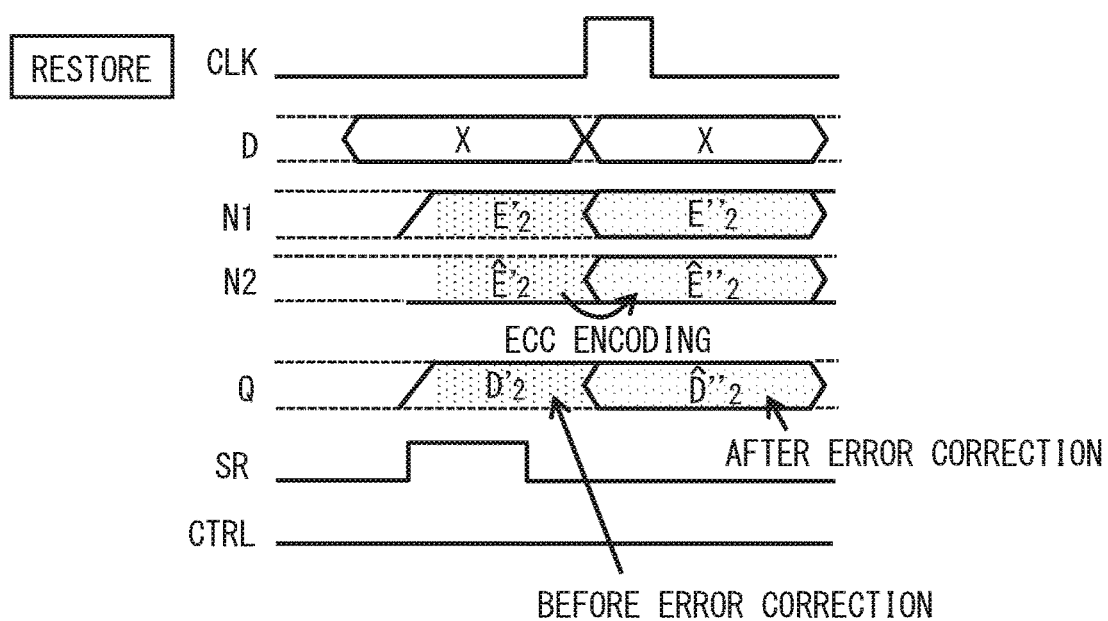

[ FIG. 15 ]
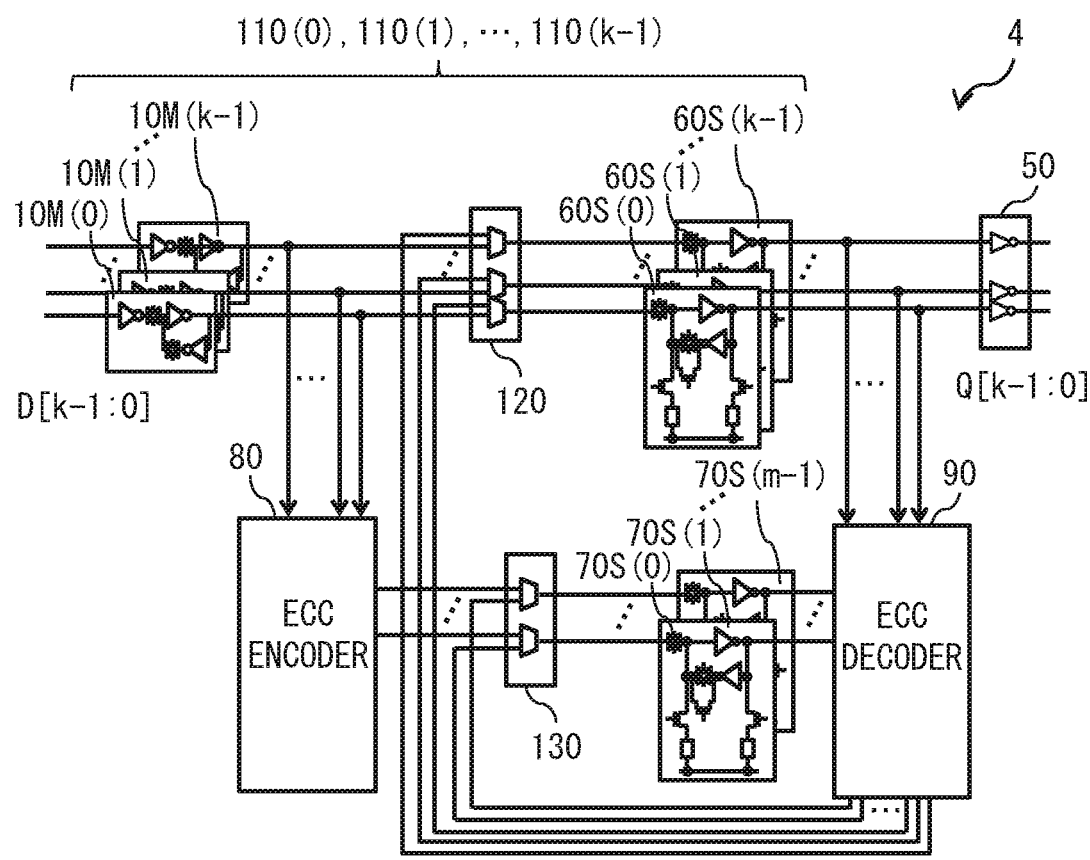

[ FIG. 16 ]
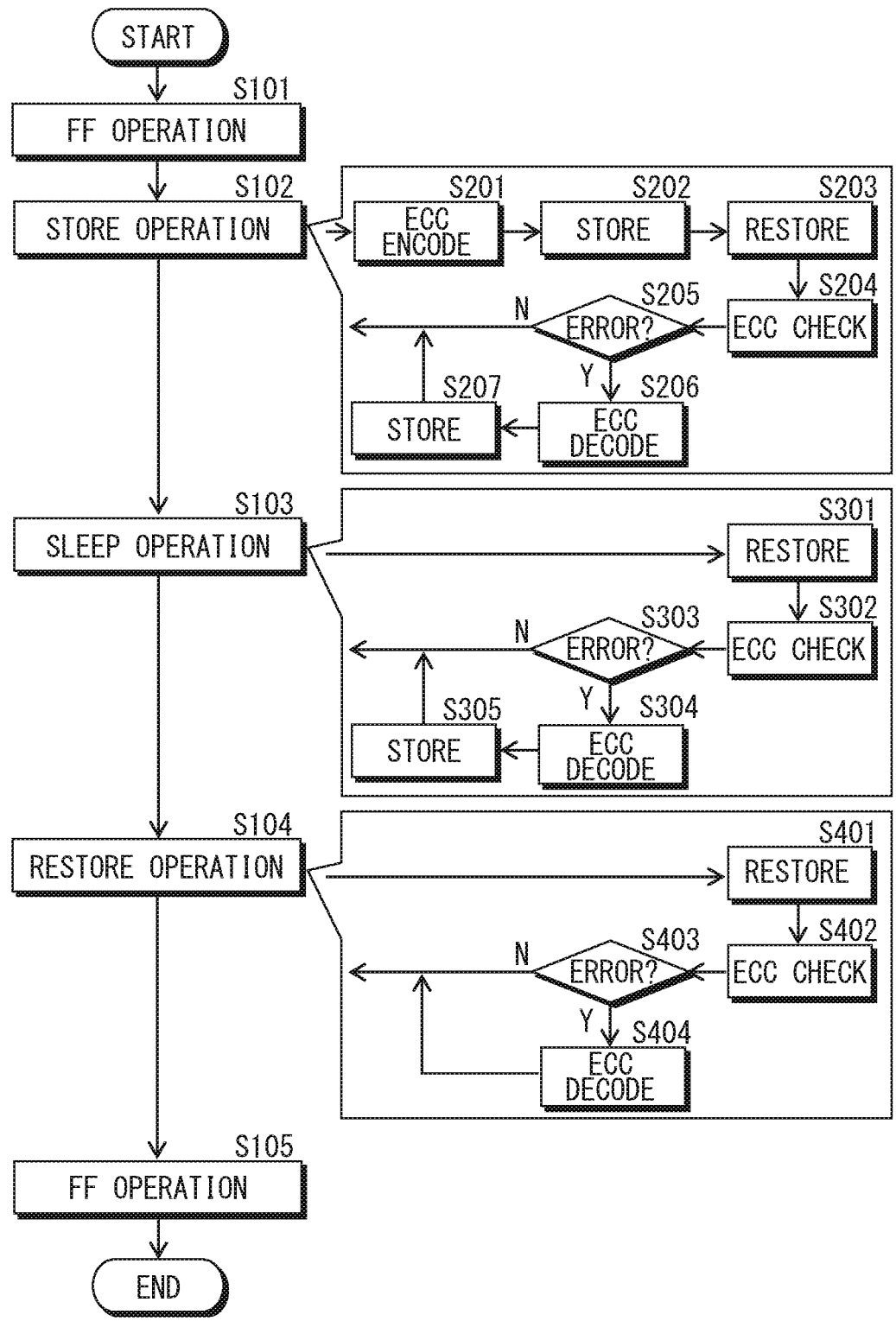

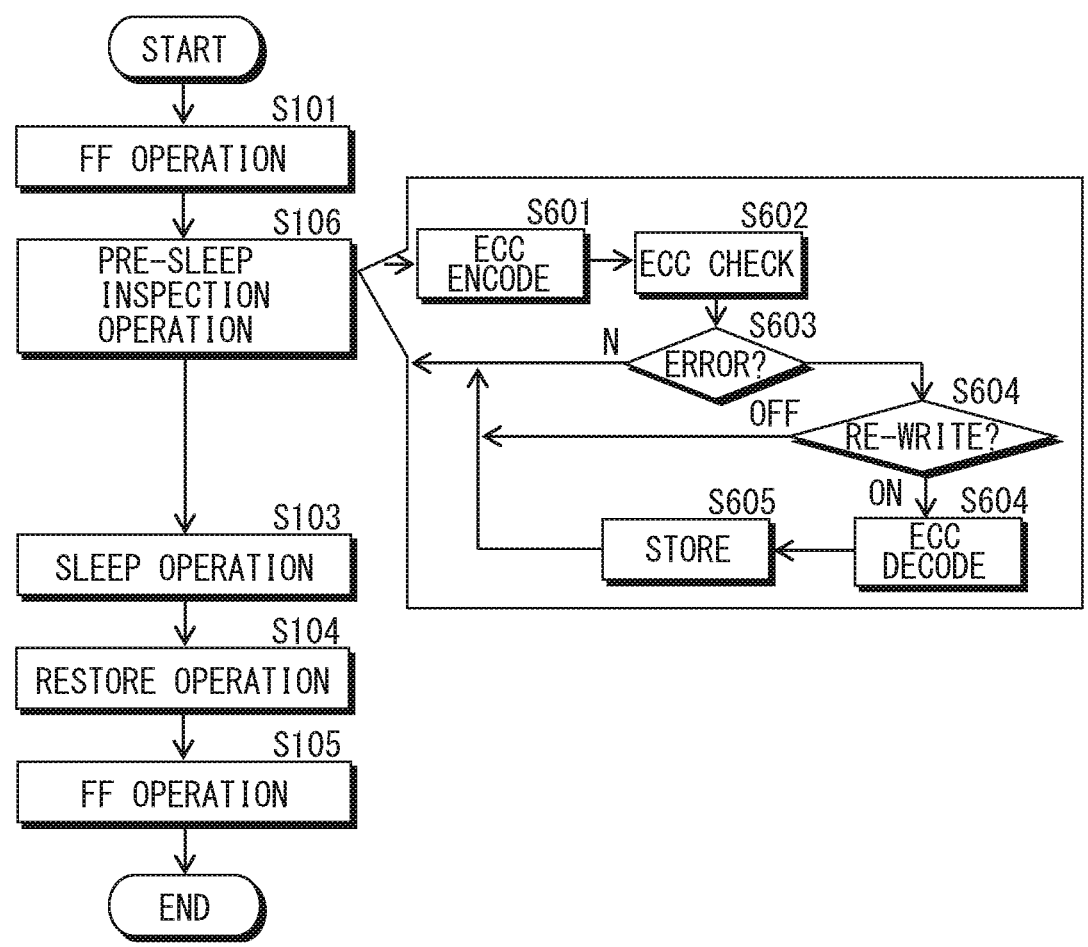
[ FIG. 17 ]

SEMICONDUCTOR CIRCUIT INCLUDING LATCH CIRCUIT FOR ERROR CORRECTION

CROSS REFERENCE TO RELATED APPLICATIONS

This application is a U.S. National Phase of International Patent Application No. PCT/JP2021/041395 filed on Nov. 10, 2021, which claims priority benefit of Japanese Patent Application No. JP 2020-191177 filed in the Japan Patent Office on Nov. 17, 2020. Each of the above-referenced applications is hereby incorporated herein by reference in its entirety.

TECHNICAL FIELD

The present disclosure relates to a semiconductor circuit.

BACKGROUND ART

Electronic devices are desired to have low power consumption from the viewpoint of ecology. For semiconductor circuits, for example, a so-called power gating technique is often used in which power consumption is reduced by selectively stopping power supply to some of circuits. A circuit the power supply to which is stopped in such a manner is desired to return to an operation state in which the power supply has not yet been stopped, immediately after the power supply is restarted. One method of achieving such a short-time return operation is to incorporate a nonvolatile memory in the circuit. Examples of the nonvolatile memory include a MTJ (Magnetic Tunnel Junction) element.

It is to be noted that a semiconductor circuit in which a nonvolatile memory is incorporated is disclosed in, for example, PTLs 1 and 2.

CITATION LIST

Patent Literature

PTL 1: Japanese Unexamined Patent Application Publication No. 2019-50068
PTL 2: Japanese Unexamined Patent Application Publication No. 2017-197486

SUMMARY OF THE INVENTION

Incidentally, in a semiconductor circuit in which a nonvolatile memory is incorporated, data held during a sleep time may be inverted for some reason, resulting in erroneous data in some cases. It is therefore desirable to provide a highly error tolerant semiconductor circuit.

A semiconductor circuit according to an embodiment of the present disclosure includes a nonvolatile latch circuit that stores k-bit data, and m-bit error correction data for the k-bit data.

The semiconductor circuit according to the embodiment of the present disclosure includes the nonvolatile latch circuit that stores the k-bit data, and the m-bit error correction data for the k-bit data. This makes it possible, after the power supply is stopped, to return to an operation state in which the power supply has not yet been stopped when the power supply is restarted. Further, even in a case where the held data is turned into the erroneous data for some reason during the power supply stop (during sleep time), it is possible to return to the operation state in which the power supply has not yet been stopped with correct data by error correction.

BRIEF DESCRIPTION OF DRAWINGS

FIG. 1 is a diagram illustrating an example of a functional block of a semiconductor circuit according to a first embodiment of the present disclosure.
FIG. 2 is a diagram illustrating an example of a circuit configuration of a first FF circuit of FIG. 1.
FIG. 3 is a diagram illustrating an example of a circuit configuration of a second FF circuit of FIG. 1.
FIG. 4 is a diagram illustrating an example of a timing chart of a store operation in the semiconductor circuit of FIG. 1.
FIG. 5 is a diagram illustrating an example of a timing chart of a restore operation in the semiconductor circuit of FIG. 1.
FIG. 6 is a diagram illustrating an example of a timing chart of the store operation in the semiconductor circuit of FIG. 1.
FIG. 7 is a diagram illustrating an example of a timing chart of the restore operation in the semiconductor circuit of FIG. 1.
FIG. 8 is a diagram illustrating an example of a functional block of a semiconductor circuit according to a second embodiment of the present disclosure.
FIG. 9 is a diagram illustrating an example of a circuit configuration of an ECC encoder and an ECC decoder in the semiconductor circuit of FIG. 8.
FIG. 10 is a diagram illustrating an example of a circuit configuration of the ECC encoder and the ECC decoder in the semiconductor circuit of FIG. 8.
FIG. 11 is a diagram illustrating an example of a functional block of a semiconductor circuit according to a third embodiment of the present disclosure.
FIG. 12 is a diagram illustrating an example a circuit configuration of an FF circuit of FIG. 11.
FIG. 13 is a diagram illustrating an example of a circuit configuration of a slave latch circuit of FIG. 11.
FIG. 14 is a diagram illustrating an example of a timing chart of a restore operation in the semiconductor circuit of FIG. 11.
FIG. 15 is a diagram illustrating an example of a functional block of a semiconductor circuit according to a fourth embodiment of the present disclosure.
FIG. 16 is a diagram illustrating an example of an operation procedure in the semiconductor circuit of FIG. 15.
FIG. 17 is a diagram illustrating an example of an operation procedure in the semiconductor circuit of FIG. 15.

MODES FOR CARRYING OUT THE INVENTION

The following describes embodiments of the present disclosure in detail with reference to the drawings. However, the embodiments described below are merely examples, and are not intended to exclude the application of various modifications and technologies not explicitly described below. Various modifications (e.g., combinations of embodiments) may be made to the present technology without departing from the scope thereof. Further, in the following description of the drawings, the same or similar parts are denoted by the same or similar reference signs. The drawings are schematic, and do not necessarily correspond to actual dimensions, ratios, or the like. In some cases, the drawings may also include parts that differ in dimension relations and ratios.

1. First Embodiment

[Configuration]

FIG. 1 illustrates an example of a functional block of a semiconductor circuit 1 according to a first embodiment of the present disclosure. The semiconductor circuit 1 is a circuit that stores information. In the semiconductor circuit 1, a controller controls reading and writing of data. For example, the controller writes information to the semiconductor circuit 1 on the basis of a write command and write data supplied from the outside, and reads information from the semiconductor circuit 1 on the basis of a read command supplied from the outside. The controller controls power supply to the semiconductor circuit 1, for example, by turning on and off a power supply transistor. In a case where the semiconductor circuit 1 is to be used, the controller turns on the power supply transistor, and supplies the semiconductor circuit 1 with a power supply voltage. In a case where the semiconductor circuit 1 is not used, the controller turns off the power supply transistor. The semiconductor circuit 1 is able to reduce power consumption by such power gating.

The semiconductor circuit 1 includes, for example, k-number of first FF (Flip Flop) circuits 10 (10(0), 10(1), . . . , 10(k–1)) and m-number of second FF circuits 20 (20(0), 20(1), . . . , 20(m–1)), as illustrated in FIG. 1. The semiconductor circuit 1 further includes, for example, an ECC (Error-Correcting Code) encoder 30, an ECC decoder 40, and an output circuit 50, as illustrated in FIG. 1.

To the ECC encoder 30, k-bit data D[k–1:0] is inputted. The k-bit data D[k–1:0] is data inputted to the semiconductor circuit 1 from the outside. The ECC encoder 30 encodes the inputted k-bit data D[k–1:0]. The ECC encoder 30 generates m-bit ECC parity data Dp[m–1:0] on the basis of the k-bit data D[k–1:0]. The m-bit ECC parity data Dp[m–1:0] is m-bit error correction data for the k-bit data D[k–1:0]. Further, the ECC encoder 30 adds the generated m-bit ECC parity data Dp[m–1:0] to the k-bit data D[k–1:0], thereby generating n (=k+m)-bit data (a data signal Din[n–1:0]). The ECC encoder 30 outputs the generated n-bit data signal Din[n–1:0] to k-number of first FF circuits 10 and m-number of second FF circuits 20. Specifically, the ECC encoder 30 outputs a k-bit data signal Din[k–1:0] to the k-number of first FF circuits 10 and outputs an m-bit data signal Din[n–1:k] to m-number of second FF circuits 20.

The k-bit data signal Din[k–1:0], a clock signal CLK, and a control signal SR are inputted to the k-number of first FF circuits 10. The k-number of first FF circuits 10 store the k-bit data signal Din[k–1:0] to be inputted. One-bit data signal out of the k-bit data signal Din[k–1:0], the clock signal CLK, and the control signal SR are inputted to each first FF circuit Each first FF circuit 10 stores a one-bit data signal out of the k-bit data signal Din[k–1:0]. From the k-number of first FF circuits 10, k-bit data (a data signal Dout[k–1:0]) is outputted to the ECC decoder 40. From each first FF circuit 10, a one-bit data signal out of the k-bit data signal Dout[k–1:0] is outputted. The clock signal CLK is a signal for controlling an operation of the first FF circuit 10. The control signal SR is a signal for controlling data storing and data restoring. The first FF circuit 10 samples data at a timing of a rising edge of the clock signal CLK and holds data during a period other than that timing.

The first FF circuit 10 includes, for example, a master latch circuit 10M and a slave latch circuit 10S, as illustrated in FIG. 2.

The master latch circuit 10M holds data or allows data to pass therethrough on the basis of the clock signal CLK. The master latch circuit 10M executes a predetermined logical operation on the clock signal CLK and the data signal. On the basis of the execution result of the logical operation, when the clock signal CLK is in a high level Hi, the master latch circuit holds the data signal captured in a latch and outputs the data signal to the slave latch circuit as an output signal QM. In contrast, when the clock signal CLK is in a low level Lo, the master latch circuit 10M allows the data signal to pass therethrough and outputs the data signal to the slave latch circuit 10S as the output signal QM.

The slave latch circuit 10S includes an SRAM (Static Random Access Memory) circuit that holds data or allows data to pass therethrough on the basis of the clock signal CLK. The SRAM circuit stores one-bit data by positive feedback. The slave latch circuit 10S executes a predetermined logical operation on the clock signal CLK and the output signal QM. On the basis of the execution result of the logical operation, when the clock signal CLK is in the high level Hi, the slave latch circuit 10S outputs a signal (an output signal QS1) passed through the output signal QM and a signal (an output signal QS2) obtained by inverting the output signal QM to the ECC decoder 40. In contrast, when the clock signal CK is in the low level Lo, the slave latch circuit 10S holds the output signal QM captured in the latch and outputs the output signals QS1 and QS2 to the ECC decoder 40.

The m-bit data signal Din[n–1:k], the clock signal CLK, and the control signal SR are inputted to the m-number of second FF circuits 20. The m-bit data signal Din[n–1:k] is the m-bit error correction data (the m-bit ECC parity data Dp[m–1:0]) for the k-bit data D[k–1:0]. The m-number of second FF circuits 20 store the m-bit data signal Din[n–1:k] to be inputted. One-bit data signal out of the m-bit data signal Din[n–1:k], the clock signal CLK, and the control signal SR are inputted to each second FF circuit 20. Each second FF circuit 20 stores a one-bit data signal out of the m-bit data signal Din[n–1:k]. From the m-number of second FF circuits m-bit data (a data signal Dout[n–1:k]) is outputted to the ECC decoder 40. From each second FF circuit 20, a one-bit data signal out of the m-bit data signal Dout[n–1:k] is outputted. The clock signal CLK is a signal for controlling an operation of the second FF circuit 20. The second FF circuit 20 samples data at a timing of a rising edge of the clock signal CLK and holds data during a period other than that timing.

The second FF circuit 20 includes, for example, a master latch circuit 20M and a slave latch circuit 20S, as illustrated in FIG. 3.

The master latch circuit 20M holds data or allows data to pass therethrough on the basis of the clock signal CLK. The master latch circuit 20M executes a predetermined logical operation on the clock signal CLK and the data signal. On the basis of the execution result of the logical operation, when the clock signal CLK is in the high level Hi, the master latch circuit holds the data signal captured in a latch and outputs the data signal to the slave latch circuit as an output signal QM. In contrast, when the clock signal CLK is in the low level Lo, the master latch circuit 20M allows the data signal to pass therethrough and outputs the data signal to the slave latch circuit 20S as the output signal QM.

The slave latch circuit 20S includes the SRAM circuit that holds data or allows data to pass therethrough on the basis of the clock signal CLK. The slave latch circuit 20S executes a predetermined logical operation on the clock signal CLK and the output signal QM. On the basis of the execution result of the logical operation, when the clock signal CLK is in the high level Hi, the slave latch circuit 10S outputs the signal (the output signal QS2) obtained by inverting the output signal QM to the ECC decoder 40. In contrast, when the clock signal CK is in the low level Lo, the slave latch circuit 20S holds the output signal QM captured in the latch and outputs the output signal QS2 to the ECC decoder 40.

The slave latch circuits 10S and 20S each include, for example, a transfer transistor Tr1 and a memory element MC1, as illustrated in FIGS. 2 and 3. The memory element MC1 is coupled, via the transfer transistor Tr1, to a node N1 to which a wiring line from which the output signal QS2 is to be outputted is coupled. The node N1 corresponds to a preceding stage of the SRAM circuit. The transfer transistor Tr1 is a transistor that is turned on and off on the basis of the control signal SR. The memory element MC1 holds data of the node N1 (store). The data held in the memory element MC1 is transferred to the node N1 via the transfer transistor Tr1 (restore). The slave latch circuits 10S and 20S each further include, for example, a transfer transistor Tr2 and a memory element MC2, as illustrated in FIGS. 2 and 3. The memory element MC2 is coupled, via the transfer transistor Tr2, to a node N2 to which a wiring line from which the output signal QS1 is to be outputted is coupled. The node N2 corresponds to a subsequent stage of the SRAM circuit. The transfer transistor Tr2 is a transistor that is turned on and off on the basis of the control signal SR. The memory element MC2 holds data of the node N2 (store). The data held in the memory element MC2 is transferred to the node N2 via the transfer transistor Tr2 (restore). In other words, the slave latch circuits 10S and 20S are non-volatile slave latch circuits that are able to store respective pieces of data of the nodes N1 and N2 or to restore the respective pieces of stored data in the nodes N1 and N2.

The memory elements MC1 and MC2 are each a non-volatile memory, and in this case, a spin transfer torque (STT) magnetic tunnel junction (MTJ) element that stores information by changing a direction of magnetization of a free layer by spin injection. One end of the memory element MC1 is coupled to a source of the transfer transistor Tr1 and the other end of the memory element MC1 is coupled to a control line CTRL. One end of the memory element MC2 is coupled to a source of the transfer transistor Tr2 and the other end of the memory element MC2 is coupled to the control line CTRL.

The memory elements MC1 and MC2 each include a pinned layer, a tunnel barrier layer, and the free layer. In this example, the respective free layers are coupled to the transfer transistors Tr1 and Tr2. The pinned layer is coupled to the control line CTRL. That is, the memory elements MC1 and MC2 each have a so-called top pinned structure in which the pinned layer, the tunnel barrier layer, and the free layer are stacked in this order.

The pinned layer includes a ferromagnetic material whose magnetization direction is fixed, for example, in a direction perpendicular to a film surface. The free layer includes a ferromagnetic material whose magnetization direction changes, for example, in a direction perpendicular to a film surface, in accordance with an incoming spin-polarized current. The tunnel barrier layer functions in such a manner as to cut off the magnetic coupling between the pinned layer and the free layer and to conduct a tunnel current.

With such a configuration, in the memory elements MC1 and MC2, for example, when the current flows from the free layer to the pinned layer, polarized electrons having a moment (spinning) in the same direction as the magnetization direction of the pinned layer are injected from the pinned layer into the free layer, and the magnetization direction of the free layer becomes the same as the magnetization direction of the pinned layer (a parallel state). In the case where the memory elements MC1 and MC2 are in such parallel states, a resistance value between both ends becomes low (a low resistance state).

Further, for example, when the current flows from the pinned layer to the free layer, electrons are injected from the free layer into the pinned layer. In this case, among the injected electrons, polarized electrons having a moment in the same direction as the magnetization direction of the pinned layer pass through the pinned layer, and polarized electrons having a moment in a direction opposite to the magnetization direction of the pinned layer are reflected by the pinned layer and injected into the free layer. As a result, the magnetization direction of the free layer becomes opposite to the magnetization direction of the pinned layer (an antiparallel state). In the case where the memory elements MC1 and MC2 are in such antiparallel states, a resistance value between both ends becomes high (a high resistance state).

As described above, in the memory elements MC1 and MC2, the magnetization direction of the free layer changes in accordance with the direction in which the current flows, and this causes the resistance state to be changed between the high resistance state and the low resistance state. The memory elements MC1 and MC2 are able to store information by setting the resistance states in this manner.

The slave latches 10S and 20S include the transfer transistors Tr1 and Tr2 and the memory elements MC1 and MC2 in addition to the SRAM circuits. Accordingly, for example, in a case where the power supply transistor is turned off to perform a sleep operation, performing a store operation immediately before the sleep operation makes it possible to cause the memory elements MC1 and MC2, which are nonvolatile memories, to store the information stored in the SRAM circuit, which is a volatile memory. The semiconductor circuit 1 then performs a restore operation immediately after the sleep operation, which makes it possible to cause the SRAM circuit to store the information stored in the memory elements MC1 and MC2. This allows the semiconductor circuit 1 to return, in a short time, to a state in which the power supply has not yet been stopped, after the power supply is restarted.

To the ECC decoder 40, n (=k+m)-bit data (a data signal Dout[n−1:0]) is inputted from the k-number of first FF circuits 10 and the m-number of second FF circuits 20. To the ECC decoder 40, the k-bit data (the data signal Dout[k−1:0]) is inputted from the k-number of first FF circuits 10, and the m-bit data (the data signal Dout[n−1:k]) is inputted from the m-number of second FF circuits 20. The ECC decoder 40 performs decoding using the inputted n-bit data (the data signal Dout[n−1:0]). The ECC decoder 40 decodes the k-bit data (the data signal Dout[k−1:0]), which is obtained by excluding the m-bit ECC parity data (the data signal Dout[n−1:k]) from the data signal Dout[n−1:0], using the m-bit ECC parity data (the data signal Dout[n−1:k]). The ECC decoder 40 outputs the k-bit data obtained by the decoding to the output circuit 50 as the k-bit data D[k−1:0].

It is to be noted that various error correction codes may be applied for an error caused by the decoding, for example, a Hamming code, a BCH code, an extended code or an odd-weight-column code thereof, a Hsiao code, an RS code, and the like. The same applies to the following embodiments.

The k-bit data D[k−1:0] is inputted to the output circuit 50 from the ECC decoder 40. The output circuit 50 outputs, for example, data obtained by inverting the inputted k-bit data D[k−1:0] to the outside as output data Q[k−1:0].

[Operation]

FIG. 4 illustrates an example of a timing chart of a store operation in the semiconductor circuit 1. FIG. 5 illustrates an example of a timing chart of a restore operation in the semiconductor circuit 1. FIG. 4 illustrates an example in which the k-bit data D[k−1:0] is inputted to the semiconductor circuit 1 and the n-bit data (the data signal Dout[n−1:0]) obtained by ECC encoding is stored in the n-bit FF circuit (the k-number of first FF circuits 10 and the m-number of second FF circuits 20). FIG. 5 illustrates an example in which error correction is performed by ECC decoding after the restoring.

In FIGS. 4 and 5, N1[n−1:0] is encoded data to be inputted to the respective nodes N1 of n-number of slave latch circuits (k-number of slave latch circuits 10S and m-number of slave latch circuits 20S). In FIGS. 4 and 5, N2[n−1:0] is data to be inputted to the respective nodes N2 of the n-number of slave latch circuits (the k-number of slave latch circuits 10S and the m-number of slave latch circuits 20S), and is data obtained by inverting N1[n−1:0]. In FIGS. 4 and 5, Q[k−1:0] is k-bit data to be outputted from the semiconductor circuit 1. The suffixes in FIGS. 4 and 5 indicate time series.

The k-bit data D[k−1:0] to be inputted from the outside changes at the rising edge of the clock signal CLK. The k-number of master latch circuits 10M latch the k-bit data D[k−1:0] at the rising edge of a signal obtained by inverting the clock signal CLK. The k-bit data latched by the k-number of master latch circuits 10M turns into n-bit data (encoded data) by the ECC encoding. The n-number of slave latch circuits (the k-number of slave latch circuits 10S and the m-number of slave latch circuits 20S) latch the n-bit encoded data N1 [n−1:0] at the rising edge of the next clock signal CLK. The n-bit encoded data N1[n−1:0] latched by the n-number of slave latch circuits turns into k-bit data Q[k−1:0] (decoded data) by the ECC decoding. The k-bit data Q[k−1:0] (the decoded data) is outputted to the outside.

In the store operation, the resistance states of the memory elements MC1 and MC2 are changed by control signals SR and CTRL from the controller. This causes the encoded data to be stored in the memory element MC1, data (inverted data) obtained by inverting the encoded data to be recorded on the memory element MC2, and data to be held in the memory elements 11 and 13 even after the power supply is turned off. In the restore operation, after the power supply is turned on, voltages of the nodes N1 and N2 are determined in accordance with the resistance states of the memory elements MC1 and MC2 by the control signals SR and CTRL from the controller. The encoded data is restored in the node N1, and the inverted data is restored in the node N2. The data restored in the node N1 can be data that differs from data at the time of the storing due to a failure or a recording condition in the memory elements MC1 and MC2. In this case, the ECC decoding is performed in the restored n-bit data to obtain error-corrected k-bit data. In FIGS. 4 and 5, it is assumed that the ECC encoding and the ECC decoding are completed within one clock-cycle.

FIG. 6 illustrates an example of a timing chart for one bit in the store operation illustrated in FIG. 4. FIG. 7 illustrates an example of a timing chart for one bit in the restore operation illustrated in FIG. 5. In the store operation, data is stored in the memory elements MC1 and MC2 by changing the resistance states of the memory elements MC1 and MC2 with the voltages of the nodes N1 and N2. In the restore operation, the voltages of the nodes N1 and N2 are determined in accordance with the resistance states of the memory elements MC1 and MC2.

[Effects]

Next, effects of the semiconductor circuit 1 according to the present embodiment will be described.

In the present embodiment, the k-number of first FF circuits 10 and the m-number of second FF circuits 20 are provided that store the k-bit data and the m-bit error correction data for the k-bit data. This makes it possible, after the power supply is stopped, to return to an operation state in which the power supply has not yet been stopped when the power supply is restarted. Further, even in a case where the held data is turned into erroneous data for some reason during the power supply stop (during sleep time), it is possible to return to the operation state in which the power supply has not yet been stopped with correct data by the error correction. It is therefore possible to provide the semiconductor circuit 1 that is highly error tolerant.

In the present embodiment, the first FF circuit(s) 10 including the k-number of master latch circuits 10M and the k-number of slave latch circuits 10S, and the second FF circuit(s) 20 including the m-number of master latch circuits 20M and the m-number of slave latch circuits 20S are provided. The k-number of slave latch circuits 10S store the k-bit data, and the m-number of slave latch circuits 20S store the m-bit error correction data. Thus, even in the case where the stored data is turned into the erroneous data for some reason, it is possible to return to the operation state in which the power supply has not yet been stopped with the correct data by the error correction. It is therefore possible to provide the semiconductor circuit 1 that is highly error tolerant.

In the present embodiment, the ECC encoder 30 that generates the m-bit error correction data is provided, and the m-bit error correction data generated by the ECC encoder 30 is stored in the m-number of slave latch circuits 20S. Thus, even in the case where the stored data is turned into the erroneous data for some reason, it is possible to return to the operation state in which the power supply has not yet been stopped with the correct data by the error correction. It is therefore possible to provide the semiconductor circuit 1 that is highly error tolerant.

In the present embodiment, the ECC decoder is provided that decodes the k-bit data outputted from the k-number of slave latch circuits 10S using the m-bit error correction data outputted from the m-number of slave latch circuits 20S. Thus, even in the case where the stored data is turned into the erroneous data for some reason, it is possible to return to the operation state in which the power supply has not yet been stopped with the correct data by the error correction. It is therefore possible to provide the semiconductor circuit 1 that is highly error tolerant.

In the present embodiment, each of the slave latch circuits 10S and 20S is provided with the nonvolatile memory elements MC1 and MC2 that hold one-bit data. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 1 that is highly error tolerant.

2. Second Embodiment

[Configuration]

FIG. 8 illustrates an example of a functional block of a semiconductor circuit 2 according to a second embodiment of the present disclosure. The semiconductor circuit 2 is a circuit that stores information. In the semiconductor circuit 2, the controller controls reading and writing of data. For example, the controller writes information to the semiconductor circuit 2 on the basis of a write command and write data supplied from the outside, and reads information from the semiconductor circuit 2 on the basis of a read command supplied from the outside. The controller controls power supply to the semiconductor circuit 2, for example, by turning on and off a power supply transistor. In a case where the semiconductor circuit 2 is to be used, the controller turns on the power supply transistor, and supplies the semiconductor circuit 2 with a power supply voltage. In a case where the semiconductor circuit 2 is not used, the controller turns off the power supply transistor. The semiconductor circuit 2 is able to reduce power consumption by such power gating.

The semiconductor circuit 2 includes, for example, the k-number of first FF circuits and the m-number of slave latch circuits 20S, as illustrated in FIG. 8. The semiconductor circuit 2 further includes, for example, the ECC encoder 30, the ECC decoder 40, and the output circuit 50, as illustrated in FIG. 8. That is, the semiconductor circuit 2 has a circuit configuration in which the m-number of master latch circuits 20M are omitted in the semiconductor circuit 1.

In the present embodiment, the ECC encoder 30 is provided between the k-number of master latch circuits 10M and the k-number of slave latch circuits 10S. In the present embodiment, an output terminal of the ECC encoder 30 is also directly coupled to respective input terminals of the m-number of slave latch circuits 20S.

FIG. 9 illustrates an example of the circuit configuration of the semiconductor circuit 2 where k=1 and n=3. In the semiconductor circuit 2 illustrated in FIG. 9, the ECC encoder includes wiring lines that couple an output terminal of the master latch circuit 10M (1) and respective input terminals of three slave latch circuits 10S(1), 20S(1), and 20S(2) to each other. Further, in the semiconductor circuit 2 illustrated in FIG. 9, the ECC decoder 40 includes three adders and one AND circuit. The first adder inputs a first signal obtained by adding respective outputs of the slave latch circuits 10S(1) and 20S(1) into one input terminal of the AND circuit. The second adder inputs a second signal obtained by adding respective outputs of the slave latch circuit 10S(1) and 20S(2) into the other input terminal of the AND circuit. The AND circuit generates a logical AND of the first signal and the second signal. The third adder outputs a signal obtained by adding the logical AND generated by the AND circuit and the output of the slave latch circuit 10S(1) to the output circuit 50. In the semiconductor circuit 2 illustrated in FIG. 9, even if there is an error in one bit out of three bits restored to the three slave latch circuits 20S(1), and 20S(2), the error is corrected and the correct data is outputted.

FIG. 10 illustrates an example of the circuit configuration of the semiconductor circuit 2 where k=4 and n=7. In the semiconductor circuit 2 illustrated in FIG. 10, the ECC encoder 30 includes wiring lines that couple respective output terminals of four master latch circuits 10M (10M(0), 10M(1), 10M(2), and 10M(3)) and respective input terminals of four slave latch circuits 10S (10S(0), 10S(1), 10S(2), and 10S(3)) with each other. The ECC encoder 30 further includes three adders. The first adder outputs a signal obtained by adding respective outputs of three master latch circuits 10M (10M (0), 10M (1), and 10M (2)) to the slave latch circuit 20S(0). The second adder outputs a signal obtained by adding respective outputs of three master latch circuits 10M (10M (1), 10M (2), and 10M (3)) to the slave latch circuit 20S(1). The third adder outputs a signal obtained by adding respective outputs of three master latch circuits 10M(10M (0), 10M (2), and 10M (3)) to the slave latch circuit 20S(2).

In the semiconductor circuit 2 illustrated in FIG. 10, the ECC decoder 40 includes seven adders, three inverter circuits, and four AND circuits. The first adder inputs a first signal obtained by adding respective outputs of the slave latch circuits 10S(0), 10S(1), 10S(2), and into the first inverter circuit and the second, third, and fourth AND circuits. The second adder inputs a second signal obtained by adding respective outputs of the slave latch circuits 10S(2), 10S(3), and 20S(1) into the second inverter circuit and the first, second, and third AND circuits. The third adder inputs a third signal obtained by adding respective outputs of the slave latch circuits 10S(0), 10S(2), 10S(3), and 20S(2) into the third inverter circuit and the first, second, and fourth AND circuits.

The first inverter circuit inputs a signal (a first inverted signal) obtained by inverting the first signal into the first AND circuit. The second inverter circuit inputs a signal (a second inverted signal) obtained by inverting the second signal into the fourth AND circuit. The third inverter circuit inputs a signal (a third inverted signal) obtained by inverting the third signal into the third AND circuit. The first AND circuit inputs a logical AND of the second signal, the third signal, and the first inverted signal into the fourth adder. The second AND circuit inputs a logical AND of the first signal, the second signal, and the third signal into the fifth adder. The third AND circuit inputs a logical AND of the first signal, the second signal, and the third inverted signal into the sixth adder. The fourth AND circuit inputs a logical AND of the first signal, the second inverted signal, and the third signal into the seventh adder.

The fourth adder outputs a signal obtained by adding the output of the slave latch circuit 10S(3) and the output of the first AND circuit to the output circuit 50. The fifth adder outputs a signal obtained by adding the output of the slave latch circuit 10S(2) and the output of the second AND circuit to the output circuit 50. The sixth adder outputs a signal obtained by adding the output of the slave latch circuit 10S(1) and the output of the third AND circuit to the output circuit 50. The seventh adder outputs a signal obtained by adding the output of the slave latch circuit 10S(0) and the output of the fourth AND circuit to the output circuit 50. The output circuit 50 outputs signals obtained by inverting the signals inputted from ECC decoder 40 as output signals Q to the outside.

[Effects]

In the present embodiment, the k-number of first FF circuits 10 and the m-number of slave latch circuits 20S are provided that latch the k-bit data and the m-bit error correction data for the k-bit data. This makes it possible, after the power supply is stopped, to return to an operation state in which the power supply has not yet been stopped when the power supply is restarted. Further, even in the case where the held data is turned into erroneous data for some reason during the power supply stop (during sleep time), it is possible to return to the operation state in which the power supply has not yet been stopped with correct data by the error correction. It is therefore possible to provide the semiconductor circuit 2 that is highly error tolerant.

In the present embodiment, the first FF circuit(s) 10 including the k-number of master latch circuits 10M and the k-number of slave latch circuits 10S, and the m-number of slave latch circuits 20S are provided. The k-number of slave latch circuits 20S store the k-bit data, and the m-number of slave latch circuits 20S store the m-bit error correction data. Thus, even in the case where the stored data is turned into the erroneous data for some reason, it is possible to return to the operation state in which the power supply has not yet been stopped with the correct data by the error correction. It is therefore possible to provide the semiconductor circuit 2 that is highly error tolerant.

In the present embodiment, the ECC encoder 30 that generates the m-bit error correction data is provided, and the m-bit error correction data generated by the ECC encoder 30 is stored in the m-number of slave latch circuits 20S. Thus, even in the case where the stored data is turned into the erroneous data for some reason, it is possible to return to the operation state in which the power supply has not yet been stopped with the correct data by the error correction. It is therefore possible to provide the semiconductor circuit 2 that is highly error tolerant.

In the present embodiment, the ECC decoder 40 is provided that decodes the k-bit data outputted from the k-number of slave latch circuits 10S using the m-bit error correction data outputted from the m-number of slave latch circuits 20S. Thus, even in the case where the stored data is turned into the erroneous data for some reason, it is possible to return to the operation state in which the power supply has not yet been stopped with the correct data by the error correction. It is therefore possible to provide the semiconductor circuit 2 that is highly error tolerant.

In the present embodiment, each of the slave latch circuits 10S and 20S is provided with the nonvolatile memory elements MC1 and MC2 that hold one-bit data. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 2 that is highly error tolerant.

3. Third Embodiment

[Configuration]

FIG. 11 illustrates an example of a functional block of a semiconductor circuit 3 according to a third embodiment of the present disclosure. The semiconductor circuit 3 is a circuit that stores information. In the semiconductor circuit 3, the controller controls reading and writing of data. For example, the controller writes information to the semiconductor circuit 3 on the basis of a write command and write data supplied from the outside, and reads information from the semiconductor circuit 3 on the basis of a read command supplied from the outside. The controller controls power supply to the semiconductor circuit 3, for example, by turning on and off a power supply transistor. In a case where the semiconductor circuit 3 is to be used, the power supply transistor is turned on, and supplies the semiconductor circuit 3 with a power supply voltage. In a case where the semiconductor circuit 3 is not used, the controller turns off the power supply transistor. The semiconductor circuit 3 is able to reduce power consumption by such power gating.

The semiconductor circuit 3 includes, for example, k-number of FF circuits 60 (60(0), 60(1), ..., 60(k−1)) and m-number of slave latch circuits 70S (70S(0), 70S(1), ..., 70S(m−1)), as illustrated in FIG. 11. The semiconductor circuit 3 further includes, for example, an ECC encoder 80, an ECC decoder 90, and the output circuit 50, as illustrated in FIG. 11.

The k-bit data signal Din[k−1:0], the clock signal CLK, and the control signal SR are inputted to the k-number of FF circuits 60. One-bit data signal out of the k-bit data signal Din[k−1:0], the clock signal CLK, and the control signal SR are inputted to each FF circuit 60. From the k-number of FF circuits 60, the k-bit data (the data signal Dout[k−1:0]) is outputted to the ECC decoder 90 and the output circuit 50. From each FF circuit 60, a one-bit data signal out of the k-bit data signal Dout[k−1:0] is outputted. The clock signal CLK is a signal for controlling an operation of the FF circuit 60. The control signal SR is a signal for controlling data storing and data restoring. The FF circuit 60 samples data at a timing of a rising edge of the clock signal CLK and holds data during a period other than that timing.

The FF circuit 60 includes, for example, a master latch circuit 60M and a slave latch circuit 60S, as illustrated in FIG. 12.

The master latch circuit 60M holds data or allows data to pass therethrough on the basis of the clock signal CLK. The master latch circuit 60M executes a predetermined logical operation on the clock signal CLK and the data signal. On the basis of the execution result of the logical operation, when the clock signal CLK is in a high level Hi, the master latch circuit holds the data signal captured in a latch and outputs the data signal to the slave latch circuit and the ECC encoder 80 as an output signal QM. In contrast, when the clock signal CLK is in a low level Lo, the master latch circuit 60M allows the data signal to pass therethrough and outputs the data signal to the slave latch circuit 60S and the ECC encoder 80 as the output signal QM.

The slave latch circuit 60S includes the SRAM circuit that holds data or allows data to pass therethrough on the basis of the clock signal CLK. The slave latch circuit 60S executes a predetermined logical operation on the clock signal CLK and the output signal QM. On the basis of the execution result of the logical operation, when the clock signal CLK is in the high level Hi, the slave latch circuit 60S outputs the signal (the output signal QS2) obtained by inverting the output signal QM to the ECC decoder 40 and the output circuit 50. In contrast, when the clock signal CK is in the low level Lo, the slave latch circuit 60S holds the output signal QM captured in the latch and outputs the output signal QS2 to the ECC decoder 40 and the output circuit 50.

To the ECC encoder 80, a k-bit output signal QM (data D[k−1:0]) is inputted. The ECC encoder 80 encodes the inputted output signal QM (data D[k−1:0]). The ECC encoder 80 generates m-bit ECC parity data on the basis of the output signal QM (data D[k−1:0]). The ECC encoder 80 outputs the generated m-bit ECC parity data Dp[m−1:0] to the m-number of slave latch circuits 70S.

For example, as illustrated in FIGS. 11 and 13, the m-bit ECC parity data Dp[m−1:0], the clock signal CLK, and the control signal SR are inputted to the m-number of slave latch circuits 70S. One-bit data signal out of the m-bit ECC parity data Dp[m−1:0], the clock signal CLK, and the control signal SR are inputted to each slave latch circuit 70S. From the m-number of slave latch circuits 70S, the m-bit ECC parity data Dp[m−1:0] is outputted to the ECC decoder 90 as the data signal Dout[n−1:k]. From each slave latch circuit 70S, a one-bit data signal out of the m-bit data signal Dout[n−1:k] is outputted. The clock signal CLK is a signal for controlling an operation of the slave latch circuit 70S. The slave latch circuit 70S samples data at a timing of a rising edge of the clock signal CLK and holds data during a period other than that timing.

The slave latch circuits 60S and 70S each include, for example, the transfer transistor Tr1 and the memory element MC1, as illustrated in FIGS. 12 and 13. The memory element MC1 is coupled to the node N1 via the transfer transistor Tr1. The transfer transistor Tr1 is a transistor that is turned on and off on the basis of the control signal SR. The slave latch circuits 60S and 70S each further include, for example, the transfer transistor Tr2 and the memory element MC2, as illustrated in FIGS. 12 and 13. The memory element MC2 is coupled to the node N2 via the transfer transistor Tr2. The transfer transistor Tr2 is a transistor that is turned on and off on the basis of the control signal SR.

As described above, the slave latches 60S and 70S include the transfer transistors Tr1 and Tr2 and the memory elements MC1 and MC2 in addition to the SRAM circuits. Accordingly, for example, in a case where the power supply transistor is turned off to perform a sleep operation, performing a store operation immediately before the sleep operation makes it possible to cause the memory elements MC1 and MC2, which are nonvolatile memories, to store the information stored in the SRAM circuit, which is a volatile memory. The semiconductor circuit 3 then performs a restore operation immediately after the sleep operation, which makes it possible to cause the SRAM circuit to store the information stored in the memory elements MC1 and MC2. This allows the semiconductor circuit 3 to return, in a short time, to a state in which the power supply has not yet been stopped, after the power supply is restarted.

To the ECC decoder 90, n (=k+m)-bit data (the k-bit data signal Dout[k−1:0] and the m-bit data signal Dout[n−1:k]) is inputted from the k-number of FF circuits 60 (slave latch circuits 60S) and the m-number of slave latch circuits 70S. To the ECC decoder 90, the k-bit data (the data signal Dout[k−1:0]) is inputted from the k-number of FF circuits 60 (slave latch circuits 60S), and the m-bit data (the data signal Dout[n−1:k]) is inputted from the m-number of slave latch circuits 70S. The ECC decoder 90 performs decoding using the inputted n-bit data (the data signal Dout[n−1:0]). The ECC decoder 90 decodes the k-bit data (the data signal Dout[k−1:0]), which is obtained by excluding the m-bit ECC parity data (the data signal Dout[n−1:k]) from the data signal Dout[n−1:0], using the m-bit ECC parity data (the data signal Dout[n−1:k]). The ECC decoder 90 outputs the k-bit data obtained by the decoding to the k-number of master latch circuits 60 as k-bit output data Dout[k−1:0].

The k-bit output data Dout[k−1:0] is inputted to the output circuit 50 from the k-number of slave latches 60S. The output circuit 50 outputs, for example, data obtained by inverting the inputted k-bit output data Dout[k−1:0] to the outside as the output data Q[k−1:0].

In the present embodiment, the master latch circuit 60M further includes, for example, a selection element SW as illustrated in FIG. 12. The selection element SW selects, in accordance with control by the controller, any one of the signal obtained by inverting the output signal QM or the signal inputted from the ECC decoder 90. The signal selected by the selection element SW is held in the master latch circuit 60M.

[Operation]

FIG. 14 illustrates an example of a timing chart of a restore operation in the semiconductor circuit 3. FIG. 14 illustrates an example in which the k-bit data D[k−1:0] is inputted, the n-bit data obtained by the ECC encoding is stored in the n-bit slave latch circuit (the memory elements MC1 and MC2), error correction is performed by ECC decoding after the restoring. In FIG. 14, N1 is encoded data to be inputted to the respective nodes N1 of n-number of slave latch circuits (k-number of slave latch circuits 60S and m-number of slave latch circuits 70S). In FIG. 14, N2 is data to be inputted to the respective nodes N2 of the n-number of slave latch circuits (the k-number of slave latch circuits 60S and the m-number of slave latch circuits and is data obtained by inverting N1. In FIG. 14, Q is k-bit data to be outputted from the semiconductor circuit 3. The suffixes in FIG. 14 indicate time series. It is to be noted that the store operation in the semiconductor circuit 3 is similar to the store operation in the semiconductor circuit 1 according to the first embodiment (see FIG. 4).

In the restore operation, after the power supply is turned on, voltages of the nodes N1 and N2 are determined in accordance with the resistance states of the memory elements MC1 and MC2 by the control signals SR and CTRL from the controller. The encoded data is restored in the node N1, and the inverted data is restored in the node N2. The data restored in the node N1 can be data that differs from data at the time of the storing due to a failure or a recording condition in the memory elements MC1 and MC2. In this case, the ECC decoding is performed in the restored n-bit data to obtain error-corrected k-bit data.

[Effects]

In the present embodiment, the k-number of FF circuits 60 and the m-number of slave latch circuits 70S are provided that latch the k-bit data and the m-bit error correction data for the k-bit data. This makes it possible, after the power supply is stopped, to return to an operation state in which the power supply has not yet been stopped when the power supply is restarted. Further, even in the case where the held data is turned into erroneous data for some reason during the power supply stop (during sleep time), it is possible to return to the operation state in which the power supply has not yet been stopped with correct data by the error correction. It is therefore possible to provide the semiconductor circuit 3 that is highly error tolerant.

In the present embodiment, the FF circuit(s) 60 including the k-number of master latch circuits 60M and the k-number of slave latch circuits 60S, and the m-number of slave latch circuits 70S are provided. The k-number of slave latch circuits 60S store the k-bit data, and the m-number of slave latch circuits 70S store the m-bit error correction data. Thus, even in the case where the latched data is turned into the erroneous data for some reason, it is possible to return to the operation state in which the power supply has not yet been stopped with the correct data by the error correction. It is therefore possible to provide the semiconductor circuit 3 that is highly error tolerant.

In the present embodiment, the ECC encoder 80 is provided that is coupled, together with the k-number of slave latch circuits 60S, in parallel to the k-number of master latch circuits 60, and generates the m-bit error correction data. The m-bit error correction data generated by the ECC encoder 80 is stored in the m-number of slave latch circuits 70. Thus, even in the case where the stored data is turned into the erroneous data for some reason, it is possible to return to the operation state in which the power supply has not yet been stopped with the correct data by the error correction. It is therefore possible to provide the semiconductor circuit 3 that is highly error tolerant.

In the present embodiment, the ECC decoder 90 is provided that decodes the k-bit data outputted from the k-number of slave latch circuits 60S using the m-bit error correction data outputted from the m-number of slave latch circuits 70S. Thus, even in the case where the stored data is turned into the erroneous data for some reason, it is possible to return to the operation state in which the power supply has not yet been stopped with the correct data by the error correction. It is therefore possible to provide the semiconductor circuit 3 that is highly error tolerant.

In the present embodiment, each of the slave latch circuits 60S and 70S is provided with the nonvolatile memory elements MC1 and MC2 that hold one-bit data. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 3 that is highly error tolerant.

In the present embodiment, the selector SW is provided in each of the k-number of master latch circuits 60. The selector SW provides the k-number of master latch circuits 60 with feedback of any one of the k-bit decoded data generated by the decoding performed by the ECC decoder 90 or the k-bit data to be outputted from the k-number of master latch circuits 60. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 3 that is highly error tolerant.

4. Fourth Embodiment

[Configuration]
FIG. 15 illustrates an example of a functional block of a semiconductor circuit 4 according to a fourth embodiment of the present disclosure. The semiconductor circuit 4 is a circuit that stores information. In the semiconductor circuit 4, the controller controls reading and writing of data. For example, the controller writes information to the semiconductor circuit 4 on the basis of a write command and write data supplied from the outside, and reads information from the semiconductor circuit 4 on the basis of a read command supplied from the outside. The controller controls power supply to the semiconductor circuit 4, for example, by turning on and off a power supply transistor. In a case where the semiconductor circuit 4 is to be used, the controller turns on the power supply transistor, and supplies the semiconductor circuit 4 with a power supply voltage. In a case where the semiconductor circuit 4 is not used, the controller turns off the power supply transistor. The semiconductor circuit 4 is able to reduce power consumption by such power gating.

The semiconductor circuit 4 includes, for example, k-number of FF circuits 110 (110(0), 110(1), . . . , 110(k−1)) and m-number of slave latch circuits 70S (70S(0), 70S(1), . . . , 70S(m−1)), as illustrated in FIG. 15. The semiconductor circuit 4 further includes, for example, selectors 120 and 130, the ECC encoder 80, the ECC decoder 90, and the output circuit 50, as illustrated in FIG. 15.

The k-bit data signal Din[k−1:0], the clock signal CLK, and the control signal SR are inputted to the k-number of FF circuits 110. One-bit data signal out of the k-bit data signal Din[k−1:0], the clock signal CLK, and the control signal SR are inputted to each FF circuit 110. From the k-number of FF circuits 110, the k-bit data (the data signal Dout[k−1:0]) is outputted to the ECC decoder 90 and the output circuit 50. From each FF circuit 110, a one-bit data signal out of the k-bit data signal Dout[k−1:0] is outputted. The clock signal CLK is a signal for controlling an operation of the FF circuit 110. The control signal SR is a signal for controlling data storing and data restoring. The FF circuit 110 samples data at a timing of a rising edge of the clock signal CLK and holds data during a period other than that timing.

The FF circuit 110 includes, for example, the master latch circuit 10M and the slave latch circuit 60S, as illustrated in FIG. 15. In the present embodiment, the master latch circuit outputs the output signal QM to the slave latch circuit 60S via the selector 120, and to the ECC encoder 80. In the present embodiment, the slave latch circuit 60S outputs the signal (the output signal QS2) obtained by inverting the output signal QM to the ECC decoder 90 and the output circuit 50.

The ECC encoder 80 outputs the generated m-bit ECC parity data Dp[m−1:0] to the selector 130. The ECC decoder 90 outputs the k-bit data obtained by the decoding to the selector 120 as the k-bit output data Dout[k−1:0]. The ECC decoder 90 further outputs the m-bit ECC parity data Dp[m−1:0] used for the decoding to the selector 130.

The selector 120 selects any one of the output signal QM (data [k−1:0]) inputted from the master latch circuit 10M or the output data Dout[k−1:0] inputted from the ECC decoder in accordance with the control of the controller. The selector 120 outputs the selected data to the k-number of slave latch circuits 60S. The selector 130 selects any one of the ECC parity data Dp[m−1:0] inputted from the ECC encoder 80 or the ECC parity data Dp[m−1:0] inputted from the ECC decoder 90 in accordance with the control of the controller. The selector 130 outputs the selected data to the m-number of slave latch circuits 70S.

[Operation]
Next, an operation in the semiconductor circuit 4 will be described. It is to be noted that a store operation and a restore operation in the semiconductor circuit 4 are similar to those in the semiconductor circuit 3.

FIG. 16 illustrates an example of a basic operation procedure in the semiconductor circuit 4. A power gating operation of the semiconductor circuit 4 transitions from an FF operation (step S101) to the store operation (step S102), the sleep operation (step S103), and the restore operation (step S104), and returns to the FF operation (step S105).

(Store Operation)
First, the semiconductor circuit 4 uses the ECC encoder 80 to encode the k-bit output signal QM (data D[k−1:0]) (step S201). The semiconductor circuit 4 stores the m-bit ECC parity data Dp[m−1:0] generated by the encoding in the m-number of slave latch circuits 70S (step S202). The semiconductor circuit 4 stores the k-bit output signal QM (data D[k−1:0]) in the k-number of slave latch circuits 60S (step S202). The semiconductor circuit 4 restores the stored data and performs ECC checking (steps S203 and S204). As a result, if the restored data has no error (step S205: N), the semiconductor circuit 4 determines that store operation has been successfully performed and terminates the store operation. If the restored data has an error (step S205: Y), the semiconductor circuit 4 decodes the restored data using the ECC decoder 90 (step S206). The semiconductor circuit 4 stores the k-bit data obtained by the decoding in the k-number of slave latch circuits 60S via the selector 120 (step S207). The semiconductor circuit 4 stores the m-bit ECC parity data Dp[m−1:0] in the m-number of slave latch circuits 70S via the selector 130 (step S207). In this way, the semiconductor circuit 4 executes the store operation. Thereafter, the power supply transistor is turned off in accordance with the control of the controller, the power supply voltage is stopped from being supplied to the semiconductor circuit 4, and a transition is made to the sleep operation.

(Sleep Operation)

The semiconductor circuit 4 checks the stored data during the sleep operation. The power supply transistor is turned on in accordance with the control of the controller, and the supply of the power supply voltage to the semiconductor circuit 4 is restarted. The semiconductor circuit 4 then first restores the stored data and performs the ECC checking (step S301 and S302). As a result, if the restored data has no error (step S303: N), the semiconductor circuit 4 determines that the store operation has been successfully performed and terminates the operation for checking the stored data. Thereafter, the power supply transistor is turned off in accordance with the control of the controller, the power supply voltage is stopped from being supplied to the semiconductor circuit 4, and a transition is made to the sleep operation.

In contrast, if the restored data has an error (step S303: Y), the semiconductor circuit 4 decodes the restored data using the ECC decoder 90 (step S304). The semiconductor circuit 4 stores the k-bit data obtained by the decoding in the k-number of slave latch circuits 60S via the selector 120 (step S305). The semiconductor circuit 4 stores the m-bit ECC parity data Dp[m−1:0] in the m-number of slave latch circuits 70S via the selector 130 (step S305). In this way, the semiconductor circuit 4 executes the operation to check the stored data. Thereafter, the power supply transistor is turned off in accordance with the control of the controller, the power supply voltage is stopped from being supplied to the semiconductor circuit 4, and a transition is made to the sleep operation again.

(Restore Operation)

The semiconductor circuit 4 returns to the FF operation from the sleep state. Specifically, first, the power supply transistor is turned on in accordance with the control of the controller, and the supply of the power supply voltage to the semiconductor circuit 4 is restarted. The semiconductor circuit 4 then restores the stored data and performs the ECC checking (step S401 and S402). As a result, if the restored data has no error (step S403: N), the semiconductor circuit 4 determines that the store operation has been successfully performed and restarts the FF operation. In contrast, if the restored data has an error (step S403: Y), the semiconductor circuit 4 decodes the restored data using the ECC decoder 90 (step S404). The semiconductor circuit 4 outputs data obtained by the decoding.

FIG. 17 illustrates another example of a basic operation procedure in the semiconductor circuit 4. In the power gating operation, if there is no change in the stored data, the semiconductor circuit 4 may perform a pre-sleep inspection operation (step S106) instead of the store operation (step S102).

(Pre-Sleep Inspection Operation)

The semiconductor circuit 4 first uses the ECC encoder 80 to encode the k-bit output signal QM (data D[k−1:0]) (step S601). The semiconductor circuit 4 performs the ECC checking on n-bit data including the m-bit ECC parity data Dp[m−1:0] generated by the encoding and the k-bit output signal QM (data D[k−1:0]) (step S602). As a result, if the acquired k-bit data D[k−1:0] has not error (step S603: N), the semiconductor circuit 4 proceeds to the sleep operation.

In contrast, if the acquired k-bit data D[k−1:0] has an error (step S603: Y), it is checked whether or not a setting for performing re-storing (re-writing) is made. As a result, if the setting for performing the re-storing (re-writing) is off (step S604: N), the semiconductor circuit 4 makes a transition to the sleep operation. In contrast, if the setting for performing the re-storing (re-writing) is on (step S604: Y), the semiconductor circuit 4 stores the k-bit data obtained by the decoding in the k-number of slave latch circuits 60S via the selector 120 (step S605). The semiconductor circuit 4 stores the m-bit ECC parity data Dp[m−1:0] in the m-number of slave latch circuits 70S via the selector 130 (step S605). In this way, the semiconductor circuit 4 executes the pre-sleep inspection operation.

[Effects]

In the present embodiment, the k-number of FF circuits 110 and the m-number of slave latch circuits 70S are provided that latch the k-bit data and the m-bit error correction data for the k-bit data. This makes it possible, after the power supply is stopped, to return to an operation state in which the power supply has not yet been stopped when the power supply is restarted. Further, even in the case where the held data is turned into erroneous data for some reason during the power supply stop (during sleep time), it is possible to return to the operation state in which the power supply has not yet been stopped with correct data by the error correction. It is therefore possible to provide the semiconductor circuit 4 that is highly error tolerant.

In the present embodiment, the FF circuit(s) 110 including the k-number of master latch circuits 10M and the k-number of slave latch circuits 60S, and the m-number of slave latch circuits 70S are provided. The k-number of slave latch circuits 60S store the k-bit data, and the m-number of slave latch circuits 70S store the m-bit error correction data. Thus, even in the case where the stored data is turned into the erroneous data for some reason, it is possible to return to the operation state in which the power supply has not yet been stopped with the correct data by the error correction. It is therefore possible to provide the semiconductor circuit 4 that is highly error tolerant.

In the present embodiment, the ECC encoder 80 is provided that is coupled, together with the k-number of slave latch circuits 60S, in parallel to the k-number of master latch circuits 10, and generates the m-bit error correction data. The m-bit error correction data generated by the ECC encoder 80 is stored in the m-number of slave latch circuits 70. Thus, even in the case where the stored data is turned into the erroneous data for some reason, it is possible to return to the operation state in which the power supply has not yet been stopped with the correct data by the error correction. It is therefore possible to provide the semiconductor circuit 4 that is highly error tolerant.

In the present embodiment, the ECC decoder 90 is provided that decodes the k-bit data outputted from the k-number of slave latch circuits 60S using the m-bit error correction data outputted from the m-number of slave latch circuits 70S. Thus, even in the case where the stored data is turned into the erroneous data for some reason, it is possible to return to the operation state in which the power supply has not yet been stopped with the correct data by the error correction. It is therefore possible to provide the semiconductor circuit 4 that is highly error tolerant.

In the present embodiment, each of the slave latch circuits 60S and 70S is provided with the nonvolatile memory elements MC1 and MC2 that hold one-bit data. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 4 that is highly error tolerant.

In the present embodiment, the selector 120 is provided that inputs any one of the k-bit decoded data generated by the decoding performed by the ECC decoder 90 or the k-bit data to be outputted from the k-number of master latch circuits 10 into the k-number of slave latch circuits 60S. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 4 that is highly error tolerant.

In the present embodiment, when returning to the FF operation from the FF operation via the store operation, the sleep operation, and the restore operation, the ECC checking is performed in any one of the store operation, the sleep operation, and the restore operation, by using the k-bit data read from the nonvolatile memory elements MC1 and MC2 provided in the k-number of slave latch circuits 60S and the m-bit error correction data read from the non-volatile memory elements MC1 and MC2 provided in the m-number of slave latch circuits 70S. Thus, even in the case where the data held in the memory elements MC1 and MC2 is turned into the erroneous data for some reason, it is possible to return to the operation state in which the power supply has not yet been stopped with the correct data by the error correction. It is therefore possible to provide the semiconductor circuit 4 that is highly error tolerant.

Although the disclosure is described hereinabove with reference to the example embodiments and modification examples, these embodiments and modification examples are not to be construed as limiting the scope of the disclosure and may be modified in a wide variety of ways. It should be appreciated that the effects described herein are mere examples. Effects of an example embodiment and modification examples of the disclosure are not limited to those described herein. The disclosure may further include any effects other than those described herein.

Further, for example, the present disclosure may have the following configurations.

(1)
A semiconductor circuit including
a nonvolatile latch circuit that stores k-bit data, and m-bit error correction data for the k-bit data.

(2)
The semiconductor circuit according to (1), in which
the nonvolatile latch circuit includes k-number of master latch circuits, k-number of first nonvolatile slave latch circuits, and m-number of second nonvolatile slave latch circuits,
the k-number of master latch circuits and the k-number of first nonvolatile slave latch circuits configure k-number of flip-flop circuits,
the k-number of first nonvolatile slave latch circuits store the k-bit data, and
the m-number of second nonvolatile slave latch circuits store the m-bit error correction data.

(3)
The semiconductor circuit according to (2), further including
an ECC encoder between the k-number of master latch circuits and the k-number of first nonvolatile slave latch circuits, the ECC encoder generating the m-bit error correction data, in which
the m-number of second nonvolatile slave latch circuits latch the m-bit error correction data generated by the ECC encoder.

(4)
The semiconductor circuit according to (3), further including
an ECC decoder that performs decoding on the k-bit data to be outputted from the k-number of first nonvolatile slave latch circuits, by using the m-bit error correction data to be outputted from the m-number of second nonvolatile slave latch circuits.

(5)
The semiconductor circuit according to (1), in which
the nonvolatile latch circuit includes k-number of first master latch circuits, k-number of first nonvolatile slave latch circuits, m-number of second master latch circuits, and m-number of second nonvolatile slave latch circuits,
the k-number of first master latch circuits and the k-number of first nonvolatile slave latch circuits configure k-number of first flip-flop circuits,
the m-number of second master latch circuits and the m-number of second nonvolatile slave latch circuits configure m-number of second flip-flop circuits,
the k-number of first nonvolatile slave latch circuits store the k-bit data, and
the m-number of second nonvolatile slave latch circuits store the m-bit error correction data.

(6)
The semiconductor circuit according to (5), further including
an ECC encoder that generates the m-bit error correction data, in which
the m-number of second nonvolatile slave latch circuits store the m-bit error correction data generated by the ECC encoder.

(7)
The semiconductor circuit according to (6), further including
an ECC decoder that performs decoding on the k-bit data to be outputted from the k-number of first nonvolatile slave latch circuits, by using the m-bit error correction data to be outputted from the m-number of second nonvolatile slave latch circuits.

(8)
The semiconductor circuit according to (2), further including
an ECC encoder that is coupled, together with the k-number of first nonvolatile slave latch circuits, in parallel to the k-number of master latch circuits, and generates the m-bit error correction data, in which
the m-number of second nonvolatile slave latch circuits store the m-bit error correction data generated by the ECC encoder.

(9)
The semiconductor circuit according to (8), further including
an ECC decoder that performs decoding on the k-bit data to be outputted from the k-number of first nonvolatile slave latch circuits, by using the m-bit error correction data to be outputted from the m-number of second nonvolatile slave latch circuits.

(10)
The semiconductor circuit according to (9), in which the k-number of master latch circuits each include a selector, the selector providing the k-number of master latch circuits with feedback of any one of k-bit decoded data generated by the decoding performed by the ECC decoder, or the k-bit data.

(11)
The semiconductor circuit according to (9), further including
a selector that inputs, to the k-number of first nonvolatile slave latch circuits, any one of k-bit decoded data generated by the decoding performed by the ECC decoder, or the k-bit data outputted from the k-number of master latch circuits.

(12)
The semiconductor circuit according to (2) to (4), in which each of the first nonvolatile slave latch circuits and each of the second nonvolatile slave latch circuits each include a nonvolatile memory that holds one-bit data.

(13)
The semiconductor circuit according to (5) to (7), in which each of the first nonvolatile slave latch circuits and each of the second nonvolatile slave latch circuits each include a nonvolatile memory that holds one-bit data.

(14)
The semiconductor circuit according to (8) to (10), in which each of the first nonvolatile slave latch circuits and each of the second nonvolatile slave latch circuits each include a nonvolatile memory that holds one-bit data.

(15)
The semiconductor circuit according to (8) to (10), in which, when returning to an FF operation from the FF operation via a store operation, a sleep operation, and a restore operation, the ECC decoder performs ECC checking in any one of the store operation, the sleep operation, and the restore operation, by using the k-bit data read from the nonvolatile memory provided in each of the k-number of first nonvolatile slave latch circuits and the m-bit error correction data read from the nonvolatile memory provided in each of the m-number of second nonvolatile slave latch circuits.

According to the semiconductor circuit of an embodiment of the present disclosure, the nonvolatile latch circuit that stores the k-bit data and the m-bit error correction data for the k-bit data is provided. This makes it possible, even in the case where the held data is inverted turned into erroneous data for some reason during sleep time to return to the operation state in which the power supply has not yet been stopped with correct data by the error correction. It is therefore possible to provide the semiconductor circuit that is highly error tolerant.

This application claims the benefit of Japanese Priority Patent Application JP2020-191177 filed with the Japan Patent Office on Nov. 17, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor circuit, comprising:
a nonvolatile latch circuit configured to store:
k-bit data including k number of bits, and
m-bit error correction data for the k-bit data, wherein
the m-bit error correction data includes m number of bits, and
the nonvolatile latch circuit includes:
a plurality of first master latch circuits;
a plurality of first nonvolatile slave latch circuits; and
a plurality of second nonvolatile slave latch circuits, wherein
the plurality of first master latch circuits and the plurality of first nonvolatile slave latch circuits correspond to a plurality of first flip-flop circuits,
the plurality of first nonvolatile slave latch circuits is configured to store the k-bit data, and
the plurality of second nonvolatile slave latch circuits is configured to store the m-bit error correction data.

2. The semiconductor circuit according to claim 1, further comprising an error-correcting code (ECC) encoder between the plurality of first master latch circuits and the plurality of first nonvolatile slave latch circuits, wherein
the ECC encoder is configured to generate the m-bit error correction data, and
the plurality of second nonvolatile slave latch circuits is further configured to store the m-bit error correction data generated by the ECC encoder.

3. The semiconductor circuit according to claim 2, further comprising an error-correcting code (ECC) decoder configured to decode the k-bit data outputted from the plurality of first nonvolatile slave latch circuits, using the m-bit error correction data outputted from the plurality of second nonvolatile slave latch circuits.

4. The semiconductor circuit according to claim 1, wherein
the nonvolatile latch circuit further includes a plurality of second master latch circuits, and
the plurality of second master latch circuits and the plurality of second nonvolatile slave latch circuits correspond to a plurality of second flip-flop circuits.

5. The semiconductor circuit according to claim 4, further comprising an error-correcting code (ECC) encoder configured to generate the m-bit error correction data, wherein the plurality of second nonvolatile slave latch circuits is further configured to store the m-bit error correction data generated by the ECC encoder.

6. The semiconductor circuit according to claim 5, further comprising an error-correcting code (ECC) decoder configured to decode the k-bit data outputted from the plurality of first nonvolatile slave latch circuits, using the m-bit error correction data outputted from the plurality of second nonvolatile slave latch circuits.

7. The semiconductor circuit according to claim 1, further comprising an error-correcting code (ECC) encoder that is coupled, together with the plurality of first nonvolatile slave latch circuits, in parallel to the plurality of first master latch circuits, wherein
the ECC encoder is configured to generate the m-bit error correction data, and
the plurality of second nonvolatile slave latch circuits is further configured to store the m-bit error correction data generated by the ECC encoder.

8. The semiconductor circuit according to claim 7, further comprising an error-correcting code (ECC) decoder configured to decode the k-bit data outputted from the plurality of first nonvolatile slave latch circuits, using the m-bit error correction data outputted from the plurality of second nonvolatile slave latch circuits.

9. The semiconductor circuit according to claim 8, wherein
each of the plurality of first master latch circuits includes a selector, and
the selector configured to input one of the decoded k-bit data or the k-bit data to the plurality of first master latch circuits.

10. The semiconductor circuit according to claim 8, further comprising a selector configured to input, to the plurality of first nonvolatile slave latch circuits, one of the decoded k-bit data or the k-bit data outputted from the plurality of first master latch circuits.

11. The semiconductor circuit according to claim 8, wherein
- in a case where the semiconductor circuit returns to an FF operation via a store operation, a sleep operation, and a restore operation, the ECC decoder is further configured to perform an ECC checking operation in one of the store operation, the sleep operation, and the restore operation, and
- the ECC checking operation is performed using the k-bit data read from a first nonvolatile memory in each of the plurality of first nonvolatile slave latch circuits and the m-bit error correction data read from a second nonvolatile memory in each of the plurality of second nonvolatile slave latch circuits.

12. The semiconductor circuit according to claim 1, wherein
- each of the first nonvolatile slave latch circuits includes a first nonvolatile memory configured to hold one-bit data, and
- each of the second nonvolatile slave latch circuits includes a second nonvolatile memory configured to hold one-bit data.

* * * * *